(12) United States Patent
Ishihara

(10) Patent No.: US 10,548,209 B2
(45) Date of Patent: Jan. 28, 2020

(54) CHAMBER APPARATUS, TARGET GENERATION METHOD, AND EUV LIGHT GENERATION APPARATUS

(71) Applicant: Gigaphoton Inc., Tochigi (JP)

(72) Inventor: Takanobu Ishihara, Oyama (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 16/261,303

(22) Filed: Jan. 29, 2019

(65) Prior Publication Data
US 2019/0159328 A1    May 23, 2019

Related U.S. Application Data

(63) Continuation of application No. PCT/JP2016/079166, filed on Sep. 30, 2016.

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *H05G 2/00* (2013.01); *H05G 2/005* (2013.01); *H05G 2/008* (2013.01)

(58) Field of Classification Search
CPC .......... H05G 2/00; H05G 2/001; H05G 2/003; H05G 2/006; H05G 2/008
(Continued)

(56) References Cited

U.S. PATENT DOCUMENTS

| 4,462,246 A | * | 7/1984 | Advani | ............ | G01N 33/0032 |
| | | | | | 204/408 |
| 2002/0051728 A1 | | 5/2002 | Sato et al. | | |

(Continued)

FOREIGN PATENT DOCUMENTS

| EP | 0 884 936 A1 | 12/1998 |
| JP | H09-232742 A | 9/1997 |

(Continued)

OTHER PUBLICATIONS

International Search Report issued in PCT/JP2016/079166; dated Jan. 24, 2017.

(Continued)

*Primary Examiner* — Jason L McCormack
(74) *Attorney, Agent, or Firm* — Studebaker & Brackett PC

(57) ABSTRACT

In a chamber apparatus that includes a chamber and a target generation device configured to supply tin as a target material to a certain region in the chamber, oxidation of molten tin is prevented. A chamber apparatus includes: a chamber (1); a target generation device including a tank part (32) configured to store tin T, a variable temperature device (33, 38) configured to change a temperature of the tin T in the tank part (32), a pressure regulator (31) configured to change a pressure in the tank part (32), and a nozzle part (34) configured to eject liquefied tin T; a gas source (40) configured to supply gas containing hydrogen gas into the chamber (1); an evacuation device (46) configured to evacuate gaseous body in the chamber (1); and a controller (2) configured to control generation of a target, in which the controller (2) controls the evacuation device (46) to maintain an oxygen partial pressure in the chamber (1) at $4\times10^{-5}$ Pa or lower.

18 Claims, 16 Drawing Sheets

(58) Field of Classification Search
USPC .................................................. 250/504 R
See application file for complete search history.

(56) References Cited

U.S. PATENT DOCUMENTS

| | | | |
|---|---|---|---|
| 2007/0062557 A1 | 3/2007 | Rakhimova et al. | |
| 2007/0166215 A1 | 7/2007 | Kempen | |
| 2008/0064227 A1* | 3/2008 | Kim | C23C 16/4407 438/787 |
| 2010/0181498 A1 | 7/2010 | Someya et al. | |
| 2010/0200776 A1 | 8/2010 | Yabu et al. | |
| 2011/0007292 A1 | 1/2011 | Van Herpen et al. | |
| 2013/0221587 A1* | 8/2013 | Shiraishi | C22B 9/00 266/200 |
| 2016/0192467 A1* | 6/2016 | Jhon | H05G 2/008 250/504 R |

FOREIGN PATENT DOCUMENTS

| | | |
|---|---|---|
| JP | 2001-267730 A | 9/2001 |
| JP | 2007-201460 A | 8/2007 |
| JP | 2010-118852 A | 5/2010 |
| JP | 2010-135557 A | 6/2010 |
| JP | 2010-199560 A | 9/2010 |
| JP | 2011-082551 A | 4/2011 |
| JP | 2011-513987 A | 4/2011 |
| JP | 2013-201118 A | 10/2013 |
| JP | 2014-154698 A | 8/2014 |

OTHER PUBLICATIONS

International Preliminary Report on Patentability and Written Opinion issued in PCT/JP2016/079166; dated Apr. 2, 2019.

* cited by examiner

CHAMBER APPARATUS, TARGET GENERATION METHOD, AND EUV LIGHT GENERATION APPARATUS

CROSS-REFERENCE TO RELATED APPLICATIONS

The present application is a continuation application of International Application No. PCT/JP2016/079166 filed on Sep. 30, 2016. The content of the application is incorporated herein by reference in its entirety.

BACKGROUND

1. Technical Field

The present disclosure relates to a chamber apparatus, a target generation method, and an extreme ultraviolet (EUV) light generation apparatus.

2. Related Art

In recent years, as semiconductor processes become finer, transfer patterns for use in photolithographies of semiconductor processes have rapidly become finer. In the next generation, microfabrication at 20 nm or less would be demanded. In order to meet the demand for microfabrication at 20 nm or less, for example, it is expected to develop an exposure device in which an EUV light generation apparatus for generating EUV light at a wavelength of 13.5 nm is combined with a reduced projection reflective optics.

Three types of EUV light generation systems have been proposed, which include a laser-produced plasma (LPP) type apparatus using plasma generated by irradiating a target material with a pulse laser beam, a discharge-produced plasma (DPP) type apparatus using plasma generated by an electric discharge, and a free-electron laser apparatus using electrons output from an electron accelerator.

CITATION LIST

Patent Literature

Patent Literature 1: Japanese Patent Application Laid-Open No. 2001-267730
Patent Literature 2: Japanese Patent Application Laid-Open No. 09-232742
Patent Literature 3: Japanese National Publication of International Patent Application No. 2011-513987
Patent Literature 4: Japanese Patent Application Laid-Open No. 2010-118852

SUMMARY

A chamber apparatus according to one aspect of the present disclosure may include a chamber, a target generation device, a gas source, an evacuation device, and a controller. The target generation device is assembled with the chamber, may be configured to supply tin as a target material to a certain region in the chamber, and may include 1. a tank part configured to store tin, 2. a variable temperature device configured to change a temperature of the tin in the tank part, 3. a pressure regulator configured to change a pressure in the tank part, and 4. a nozzle part having a nozzle hole configured to eject liquefied tin. The gas source may be configured to supply gas containing hydrogen gas into the chamber. The evacuation device may be configured to evacuate gaseous body in the chamber. The controller may be configured to control generation of a target and to control A. the evacuation device to maintain an oxygen partial pressure in the chamber at $4\times10^{-5}$ Pa or lower, B. the variable temperature device to melt the tin, C. the pressure regulator to eject the molten tin from the nozzle hole, and D. the gas source to supply the gas containing hydrogen gas into the chamber after the ejection.

A target generation method according to one aspect of the present disclosure may use a chamber apparatus that may include a chamber, a target generation device, a gas source, an evacuation device, and a controller to supply tin to a certain region in the chamber. The target generation device is assembled with the chamber, may be configured to supply tin as a target material to a certain region in the chamber, and may include 1. a tank part configured to store tin, 2. a variable temperature device configured to change a temperature of the tin in the tank part, 3. a pressure regulator configured to change a pressure in the tank part, and 4. a nozzle part having a nozzle hole configured to eject liquefied tin. The gas source may be configured to supply gas containing hydrogen gas into the chamber. The evacuation device may be configured to evacuate gaseous body in the chamber. The controller may be configured to control generation of a target. The target generation method may include controlling, by the controller, A. the evacuation device to maintain an oxygen partial pressure in the chamber at $4\times10^{-5}$ Pa or lower, B. the variable temperature device to melt the tin, C. the pressure regulator to eject the molten tin from the nozzle hole, and D. the gas source to supply the gas containing hydrogen gas into the chamber after the ejection.

An extreme ultraviolet (EUV) light generation apparatus according to one aspect of the present disclosure may include a chamber, a target generation device, a gas source, an evacuation device, a controller, a laser device, and a light collection mirror. The target generation device is assembled with the chamber, may be configured to supply tin as a target material to a certain region in the chamber, and may include 1. a tank part configured to store tin, 2. a variable temperature device configured to change a temperature of the tin in the tank part, 3. a pressure regulator configured to change a pressure in the tank part, and 4. a nozzle part having a nozzle hole configured to eject liquefied tin. The gas source may be configured to supply gas containing hydrogen gas into the chamber. The evacuation device may be configured to evacuate gaseous body in the chamber. The controller may be configured to control generation of a target and to control A. the evacuation device to maintain an oxygen partial pressure in the chamber at $4\times10^{-5}$ Pa or lower, B. the variable temperature device to melt the tin, C. the pressure regulator to eject the molten tin from the nozzle hole, and D. the gas source to supply the gas containing hydrogen gas into the chamber after the ejection. The laser device may be configured to emit a laser beam to the tin supplied into the chamber. The light collection mirror may be configured to collect EUV light radiated from plasma of the tin generated by irradiating the tin with the laser beam and output the collected EUV light.

BRIEF DESCRIPTION OF DRAWINGS

Some embodiments of the present disclosure will be described below as examples, with reference to the attached drawings.

DESCRIPTION OF EMBODIMENTS

Table of Contents
1. Overall Description of EUV Light Generation Apparatus
1.1 Configuration
1.2 Operation
2. Comparative Example
2.1 Configuration
2.2 Operation
2.3 Problem
3. First Embodiment
3.1 Configuration of the First Embodiment
3.2 Operation of the First Embodiment
3.3 Effects of the First Embodiment
4. Second Embodiment
4.1 Configuration of the Second Embodiment
4.2 Operation of the Second Embodiment
4.3 Effects of the Second Embodiment
5. Third Embodiment
5.1 Configuration of the Third Embodiment
5.2 Operation of the Third Embodiment
5.3 Effects of the Third Embodiment
6. Fourth Embodiment
6.1 Configuration of the Fourth Embodiment
6.2 Operation of the Fourth Embodiment
6.3 Effects of the Fourth Embodiment
7. Fifth Embodiment
7.1 Configuration of the Fifth Embodiment
7.2 Operation of the Fifth Embodiment
7.3 Effects of the Fifth Embodiment Embodiments of the present disclosure will be described below in detail with reference to the attached drawings. The embodiments to be described below are some illustrative examples of the present disclosure, and do not limit the scope of the present disclosure. In addition, not all of the configurations and operations of the embodiments to be described below are necessarily essential configurations and operations of the present disclosure. Note that common constituent elements will be denoted with the same reference numbers, and redundant descriptions will be omitted.

1. Overall Description of EUV Light Generation Apparatus
   1.1 Configuration

Figure 1:
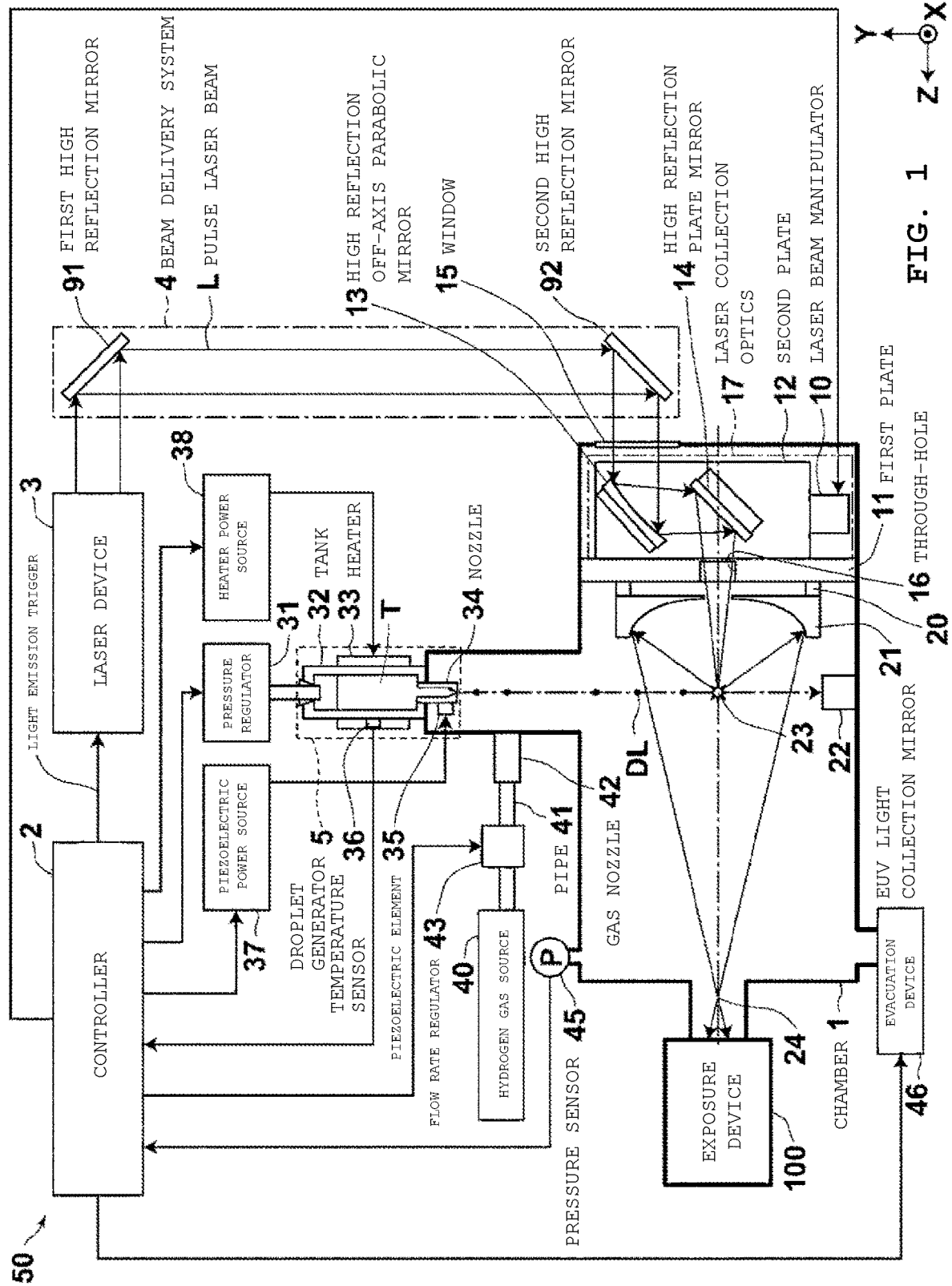
FIG. 1 is a schematic side view that illustrates the entire configuration of a typical EUV light generation apparatus.

FIG. 1 is a schematic side view that illustrates the entire configuration of a typical EUV light generation apparatus. The EUV light generation apparatus illustrated in FIG. 1 is used for supplying an exposure device 100 with EUV light used as exposure light. In other words, an EUV light generation apparatus 50 is constituted by elements except the exposure device 100 illustrated in FIG. 1. The EUV light generation apparatus 50 is an apparatus adopting the laser produced plasma (LPP) that irradiates a target material (substance) with a laser beam to turn the target material into plasma, so that EUV light is generated. The EUV light generation apparatus 50 includes a chamber 1, a controller 2, a laser device 3, and a beam delivery system 4.

The chamber 1 is a chamber for generating EUV light therein, and is preferably a vacuum chamber. The chamber 1 includes a droplet generator 5, a laser beam manipulator 10, a first plate 11, a second plate 12 held in the chamber 1 with the laser beam manipulator 10, a high reflection off-axis parabolic mirror 13 held on the second plate 12, a high reflection plate mirror 14 similarly held on the second plate 12, and a window 15 for introducing a laser beam. Note that the first plate 11 has a through-hole 16 for introducing a laser beam. The high reflection off-axis parabolic mirror 13 and the high reflection plate mirror 14 with the laser beam manipulator 10 constitute a laser collection optics 17 for collecting a pulse laser beam L that will be described later.

The chamber 1 further includes an EUV light collection mirror holder 20, an EUV light collection mirror 21 held on the EUV light collection mirror holder 20, and a target receiver 22. The EUV light collection mirror 21 is a mirror having, for example, a spheroidal reflection surface. The EUV light collection mirror 21 is arranged so that a first focal point is located in a plasma generation region 23 and a second focal point is located at an intermediate focal point (IF) 24. On a surface of the EUV light collection mirror 21, a multilayer reflection film in which molybdenum and silicon are alternately layered, for example, may be formed.

The chamber 1 further includes a hydrogen gas source 40, a pipe 41 for transmitting hydrogen gas supplied from the hydrogen gas source 40, a gas nozzle 42 attached to a tip end of the pipe 41 and opened in the chamber 1, and a flow rate regulator 43 disposed midway along the pipe 41. The chamber 1 further includes a pressure sensor 45 configured to detect a pressure in the chamber 1 and an evacuation device 46 configured to evacuate the chamber 1.

The laser device 3 generates the pulse laser beam L for turning the target material into plasma. In an example, as the laser device 3, a master oscillator power amplifier type laser apparatus is applied. Alternatively, as the laser device 3, for example, a combination of an yttrium aluminum garnet (YAG) laser apparatus configured to generate a prepulse laser beam and a $CO_2$ laser apparatus configured to generate a main pulse laser beam is applicable. Furthermore, as the laser device 3, other types of laser apparatuses may be used. The pulse laser beam L output from the laser device 3 is a laser beam having a pulse width of several nanoseconds to several tens of nanoseconds and thus having a frequency of about 10 kHz to 100 kHz, for example.

The beam delivery system 4 includes a first high reflection mirror 91 and a second high reflection mirror 92. The first high reflection mirror 91 reflects the pulse laser beam L output from the laser device 3 to change a traveling direction of the pulse laser beam L. The second high reflection mirror 92 reflects the pulse laser beam L reflected by the first high reflection mirror 91 to the window 15. The laser collection optics 17 is arranged to receive the laser beam L output from the beam delivery system 4. The laser beam manipulator 10 can change the positions of the high reflection off-axis parabolic mirror 13 and the high reflection plate mirror 14 through the second plate 12. With this configuration, an incident position of the laser beam L in the chamber 1 with respect to the X, Y, and Z axial directions is moved to a position specified by the controller 2.

The droplet generator 5 supplies a target material T in the form of a spherical droplet DL into the chamber 1, the target material T being used for generating EUV light. The target material T may generally contain tin, terbium, gadolinium, lithium, xenon, or a combination of two or more elements selected from the aforementioned elements. It should be noted that the present disclosure will describe a chamber apparatus, a target generation method, and an EUV light generation apparatus with the premise of using tin in particular. Accordingly, any "target material T" described later is tin. The droplet generator 5 includes a pressure regulator 31, a tank 32 configured to store the melted target material T, a heater 33 configured to melt the target material T, a nozzle 34 having a nozzle hole configured to eject the melted target material T as the droplet DL, a piezoelectric element 35 configured to vibrate a side wall of the nozzle 34, and a temperature sensor 36 configured to detect a temperature of the tank 32. The tank 32 is a tank part and the nozzle 34 is a nozzle part in the present disclosure. The droplet DL is generated intermittently and periodically, traveling on a droplet trajectory in the chamber 1.

The tank 32 is connected to the pressure regulator 31. The pressure regulator 31 is connected to the controller 2. The droplet generator 5 is provided with a piezoelectric power source 37 configured to drive the piezoelectric element 35 and a heater power source 38 configured to drive the heater 33. The piezoelectric power source 37, the heater power source 38, and the temperature sensor 36 described above are connected to the controller 2. The heater 33 and the heater power source 38 constitute a variable temperature device in the present disclosure. Note that the EUV light generation apparatus 50 may include a not-illustrated droplet sensor for detecting a presence, a trajectory, a position, a speed, and other attributes of the droplet DL.

1.2 Operation

In the above-mentioned configuration, the target material T in the tank 32 is heated to a predetermined temperature that is the melting point thereof or higher by the heater 33. When the target material T is tin (Sn), tin is heated to a temperature in a temperature range between 250° C. and 290° C., which is the melting point of tin (232° C.) or higher. In order to perform the heating, the controller 2 may control the operation of the heater power source 38 to adjust a temperature. The controller 2 controls the operation of the pressure regulator 31, whereby the pressure in the tank 32 is maintained at a pressure for outputting a jet of the melted target material T at a predetermined speed from the nozzle 34. The controller 2 causes the piezoelectric power source 37 to apply a droplet supply signal that is a voltage signal having a certain waveform to the piezoelectric element 35. Accordingly, the piezoelectric element 35 vibrates and the vibration is applied to the nozzle 34. The jet output from the nozzle 34 is fragmented at a predetermined period by the vibration of the nozzle 34 and the droplets DL formed by the fragmentation are intermittently supplied into the chamber 1.

To the controller 2, a signal representing a presence, a trajectory, a position, a speed, and other attributes of the droplet DL is input from, for example, the aforementioned not-illustrated droplet sensor. Receiving a timing signal indicating that the droplet DL has passed a predetermined position, the controller 2 outputs a light emission trigger after a predetermined delay time has elapsed from the reception of the timing signal. The light emission trigger is input to the laser device 3. Receiving the light emission trigger, the laser device 3 outputs the pulse laser beam L, for example, by opening a light shutter in the laser device 3. The pulse laser beam L is reflected by the first high reflection mirror 91 and the second high reflection mirror 92 in the beam delivery system 4, passes through the window 15, and enters the chamber 1.

The pulse laser beam L is reflected by the high reflection off-axis parabolic mirror 13 and the high reflection plate mirror 14 in the laser collection optics 17, passes through the opening provided at the center of the EUV light collection mirror 21, and travels on the light axis of the EUV light collection mirror 21. The pulse laser beam L is focused at the plasma generation region 23 by the effect of the high reflection off-axis parabolic mirror 13. Reaching the plasma generation region 23, the droplet DL is irradiated with the focused pulse laser beam L and turned into plasma, the plasma generating EUV light. Note that the droplet DL not irradiated with the pulse laser beam L is received by the target receiver 22.

The droplet DL is periodically generated and the pulse laser beam L is output for each time the droplet sensor detects the droplet DL, and therefore the EUV light is periodically generated. The EUV light thus periodically generated is focused at an intermediate focus point 24 and then enters the exposure device 100. In the exposure device 100, the entered EUV light is used for semiconductor exposure or the like.

Note that the plasma generation region 23 may be moved in accordance with a command from the exposure device 100. The plasma generation region 23 can be moved by moving the high reflection off-axis parabolic mirror 13 and the high reflection plate mirror 14 by the aforementioned laser beam manipulator 10. The operation of the laser beam manipulator 10 is controlled by the controller 2.

After the droplet generator 5 is assembled with the chamber 1, the evacuation device 46 may be driven in accordance with a command from the controller 2 to evacuate the air in the chamber 1. In order to evacuate atmospheric components, purging and evacuating the chamber 1 may be repeated. A purge gas may be nitrogen ($N_2$) or argon (Ar). The target material T in the tank 32 may be used in an ingot form. There may be a space between the ingot and the inside of the tank 32.

Furthermore, into the chamber 1, hydrogen gas may be introduced at a low flow rate from the hydrogen gas source 40 through the pipe 41, the gas nozzle 42, and the flow rate regulator 43. The hydrogen gas is introduced to reduce the oxygen partial pressure in the chamber 1 by a reaction represented by the following reaction formula:

$$2H_2+O_2 \rightarrow 2H_2O,$$

so as to prevent the target material T, for example, tin from being oxidized. Note that high-purity hydrogen gas may be introduced without the premise of the aforementioned reaction.

In the EUV light generation apparatus 50 in this example, a target generation device includes the pressure regulator 31, the tank 32, the heater 33 and the heater power source 38 constituting the variable temperature device, and the nozzle 34. A chamber apparatus includes, in addition to the chamber 1, the aforementioned target generation device, the hydrogen gas source 40, the evacuation device 46, and the controller 2. The EUV light generation apparatus 50 includes this chamber apparatus, the laser device 3, the beam delivery system 4, and the laser collection optics 17. Note that "target generation" is synonymous with "droplet generation" because the target is supplied to the plasma generation region 23 as the droplet DL in this example.

2. Comparative Example 2.1 Configuration of the Comparative Example

Figure 2:
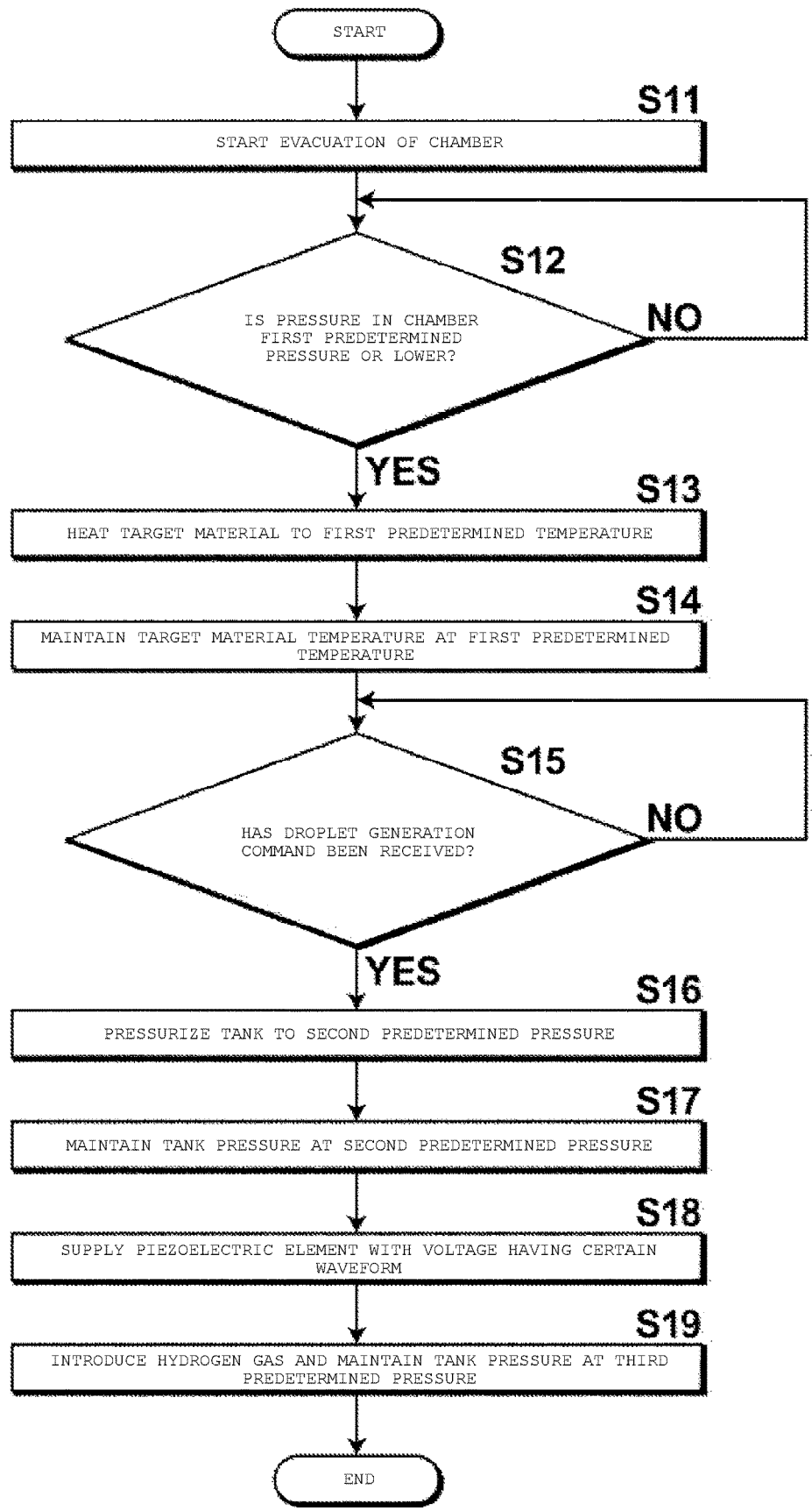
FIG. 2 is a flowchart that illustrates the flow of target generation processing in an EUV light generation apparatus presented as a comparative example.
Figure 3:
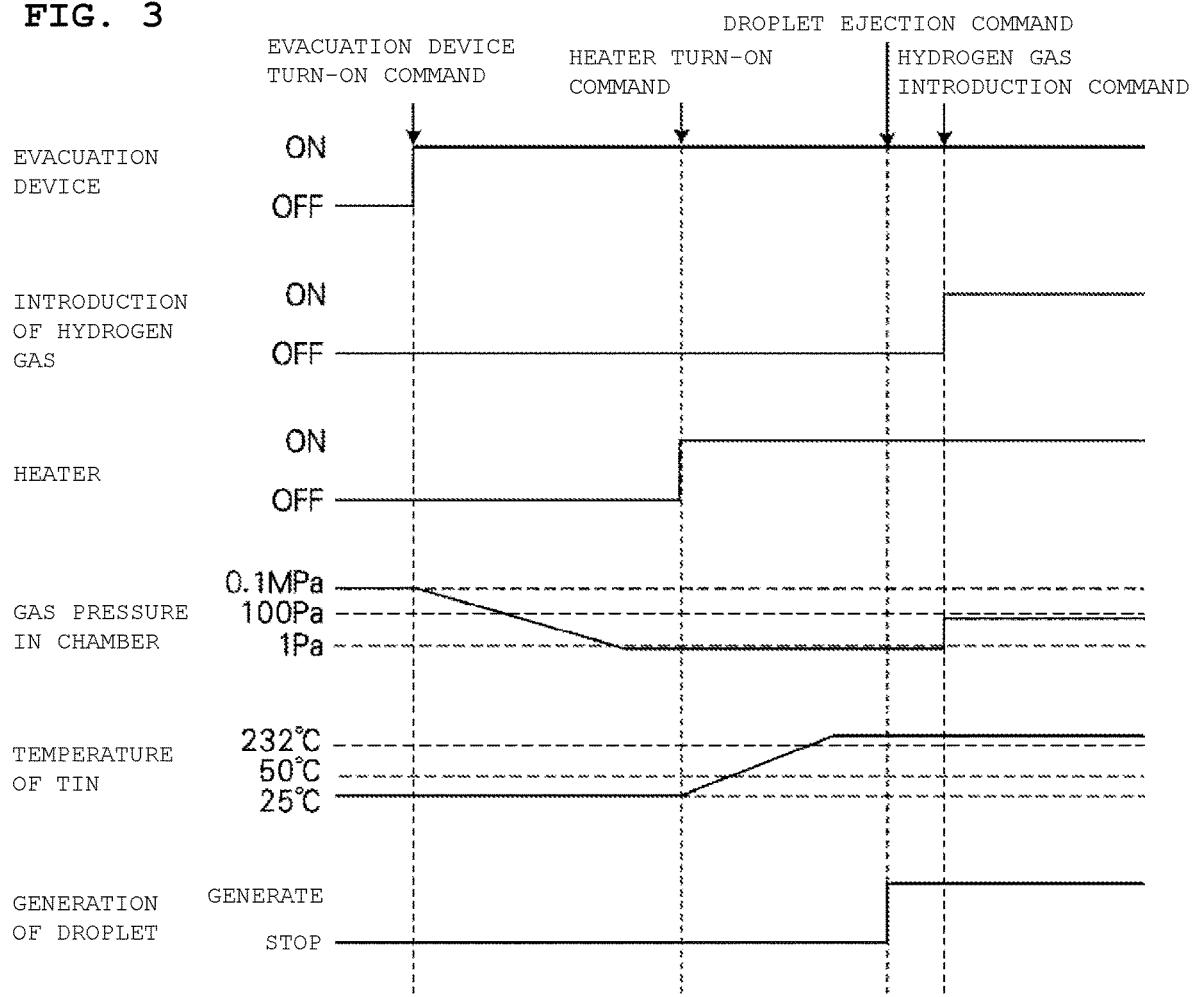
FIG. 3 is a timing chart for the target generation processing illustrated in FIG. 2.

With reference to FIG. 2 and FIG. 3, the following will describe a target generation method, or a droplet generation method as the comparative example in the configuration illustrated in FIG. 1. FIG. 2 is a flowchart that illustrates the flow of processes in the droplet generation method. FIG. 3 is a timing chart illustrating timing of operation or the like of the elements related to the processes.

Basically, the processes illustrated in FIG. 2 are executed on the basis of the control by the controller 2. FIG. 3 illustrates in particular timing of turning on and off (drive and stop) of the evacuation device 46, the turning on and off of the introduction of hydrogen gas by the flow rate regulator 43, and the turning on and off of the heater 33. FIG. 3 further illustrates the conditions in the chamber 1, in other words, a gas pressure, a temperature of tin, and timing of generation and stop or the like of the droplet DL, the conditions varying when the evacuation device 46, the flow rate regulator 43, or the heater 33 turns on or off.

2.2 Operation of the Comparative Example

As illustrated in FIG. 2, when the droplet generation processing starts, the controller 2 first issues a command to turn on the evacuation device 46 ("EVACUATION DEVICE TURN-ON COMMAND" in FIG. 3) at Step S11 to start evacuating the chamber 1. By the evacuation, the gas pressure in the chamber 1 is gradually reduced. The controller 2 detects the gas pressure on the basis of the output from the pressure sensor 45, and determines whether the gas pressure is a first predetermined pressure or lower at Step S12. For example, the first predetermined pressure may be 1 Pa. If the gas pressure is higher than the first predetermined pressure, the process flow returns to Step S12. If the gas pressure becomes the first predetermined pressure or lower, the controller 2 issues a command to turn on the heater power source 38 ("HEATER TURN-ON COMMAND" in FIG. 3) at Step S13 to turn on the heater 33, in other words, set the heater 33 in a heating state. Thus, the target material T in the tank 32 is heated to the first predetermined temperature that is the melting point thereof or higher (Step S13).

The controller 2 causes the heater 33 to heat the target material T while monitoring the temperature with the temperature sensor 36, appropriately turns off the heater power source 38 as needed, and thereby maintains the temperature of the tank 32, in other words, the temperature of tin as the target material T at the first predetermined temperature (Step S14). Thus, the target material T in the tank 32 melts. The first predetermined temperature is 232° C. in one example but not limited thereto, and may be a value between 250° C. and 290° C.

Next, the controller 2 determines whether the droplet generation command has been received at Step S15. If the command has not been received, the process flow returns to Step S15 and the controller 2 repeats this determination. If the droplet generation command has been received, the controller 2 controls the operation of the pressure regulator 31 to pressurize the tank 32 to a second predetermined pressure (Step S16), and maintains the second predetermined pressure (Step S17). For example, the second predetermined pressure may be 3 MPa or higher.

After the pressure in the tank 32 is maintained at the second predetermined pressure, the controller 2 issues, to the piezoelectric power source 37, a command to supply the piezoelectric element 35 with a voltage having a certain waveform ("DROPLET EJECTION COMMAND" in FIG. 3) at Step S18. Thus, the melted target material T is ejected from the nozzle hole of the nozzle 34 as the droplet DL generated at a predetermined period. Then, the controller 2 issues, to the flow rate regulator 43, a command to introduce hydrogen gas from the hydrogen gas source 40 into the chamber 1 ("HYDROGEN GAS INTRODUCTION COMMAND" in FIG. 3) at Step S19. Next, the controller 2 causes the flow rate regulator 43 to adjust the flow rate of hydrogen gas to maintain the pressure in the chamber represented by the output signal from the pressure sensor 45 at a third predetermined pressure. Note that, for example, the third predetermined pressure may be 100 Pa or lower. Thus, the sequence of the droplet generation processing is completed.

2.3 Problem

Tin as the target material T is a metal that is easily oxidized, and it is generally known that oxidation of tin advances in accordance with the following reaction formula:

$$Sn+O_2 \rightarrow SnO_2.$$

Figure 4:
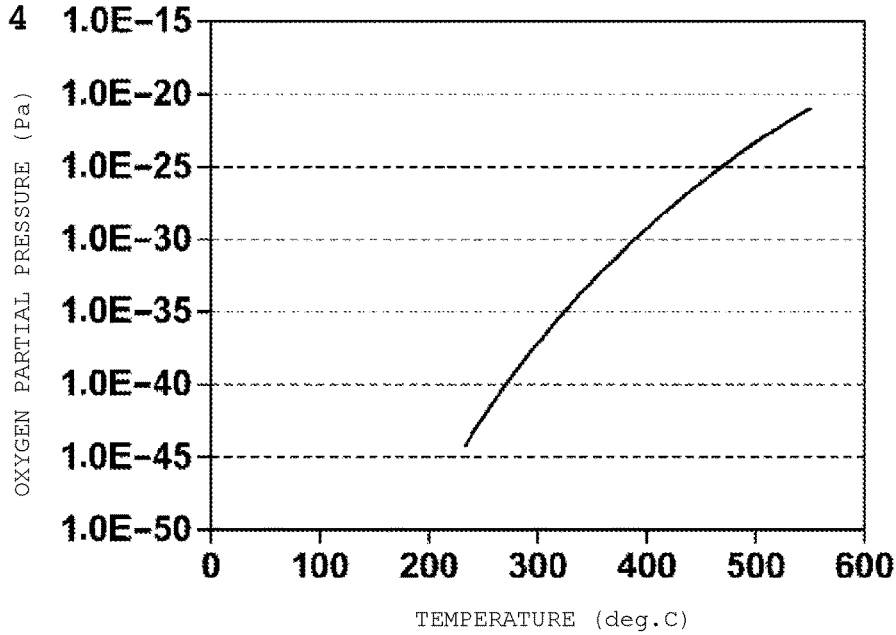
FIG. 4 is a graph that illustrates the characteristic of a saturated oxygen partial pressure in tin.

This knowledge has been disclosed in, for example, Zhangfu Yuan, Kusuhiro Mukai, Katsuhiko Takagi, and Masahiko Ohtaka, Journal of the Japan Institute of Metals and Materials, Vol. 65 (2001), pp. 21-28. Here, FIG. 4 illustrates a calculation result of the equilibrium oxygen partial pressure (saturated oxygen partial pressure) of tin when an activity of Sn and $SnO_2$ is 1. According to FIG. 4, when the temperature of tin is between 250° C. and 290° C., the saturated oxygen partial pressure of tin is between $6 \times 10^{-43}$ Pa and $8 \times 10^{-39}$ Pa. If the oxygen partial pressure in the chamber is the saturated oxygen partial pressure or lower, tin is prevented from being oxidized. It is, however, substantially impossible to reduce the oxygen partial pressure to the saturated oxygen partial pressure, and therefore tin exposed to the atmosphere in the chamber is oxidized, whereby tin oxide precipitates.

In addition, until the molten tin is ejected from the nozzle hole of the nozzle 34 after a tin ingot starts to melt, there is a space between the nozzle hole and tin. The oxygen partial pressure in the space is the same as the oxygen partial pressure in the chamber and is extraordinary higher than the saturated oxygen partial pressure of tin. Thus, tin oxide precipitates on the upstream side with respect to the nozzle hole. In particular, after tin is melted, oxidation of tin advances due to, for example, high temperature.

The tin oxide is solid and thus causes clogging of the nozzle hole. Even if the droplet DL is generated without clogging the nozzle hole, when the tin oxide presents near the nozzle hole, the ejection direction of the droplet DL can be changed. If the change is large, the pulse laser beam cannot be focused on and emitted to the droplet DL.

In this aspect, the following embodiment discloses a chamber apparatus, a target generation method, and an EUV light generation apparatus that can suppress oxidation of molten tin as the target material T.

3. First Embodiment

3.1 Configuration of the First Embodiment

Figure 5:
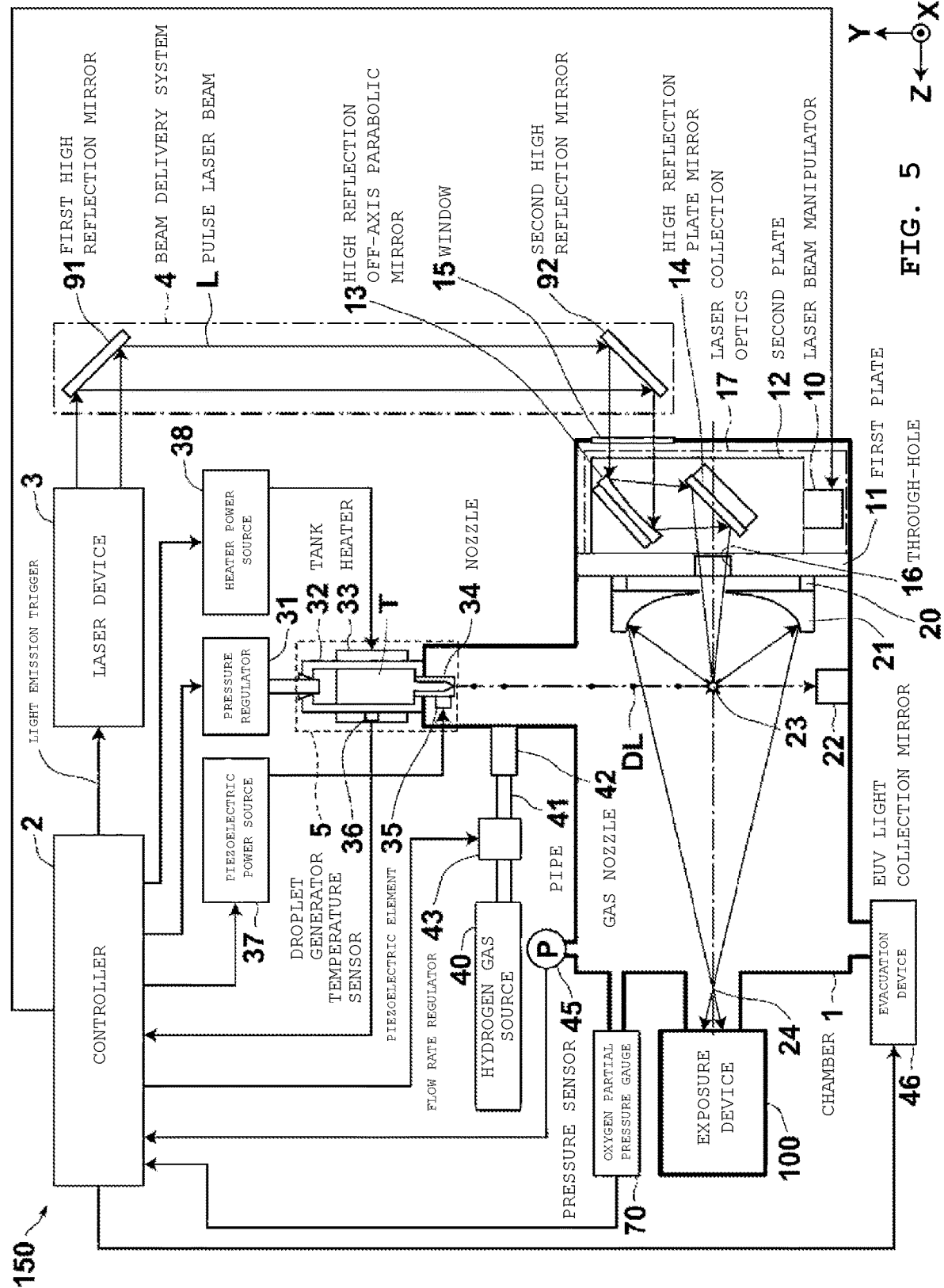
FIG. 5 is a schematic side view that illustrates the entire configuration of an EUV light generation apparatus according to a first embodiment.

Next, the first embodiment will be described with reference to FIG. 5, FIG. 6, and FIG. 7. FIG. 5 is a schematic view that illustrates a schematic configuration of an EUV light generation apparatus 150 including a chamber apparatus according to the first embodiment. When the EUV light generation apparatus 150 in the first embodiment is compared with the EUV light generation apparatus 50 in the comparative example illustrated in FIG. 1, the EUV light generation apparatus 150 is basically different from the EUV light generation apparatus 50 in the point that the former apparatus includes an oxygen partial pressure gauge 70 configured to measure the oxygen partial pressure in the chamber 1. The output signal from the oxygen partial pressure gauge 70 is input to the controller 2. Note that the control by the controller 2 is partially different from the control by the controller 2 in the comparative example.

As the oxygen partial pressure gauge 70, a mass spectrometer or a zirconia oxygen analyzer, for example, is applicable. As the evacuation device 46, a displacement pump or a dry pump such as a roots type or a scroll type is applicable. It is preferable that a bearing part or the like of the dry pump be purged with high-purity nitrogen gas or the like. In that case, it is preferable that nitrogen gas or the like used for purging have an oxygen concentration of 0.1 vol.ppm or lower.

3.2 Operation of the First Embodiment

Figure 6:
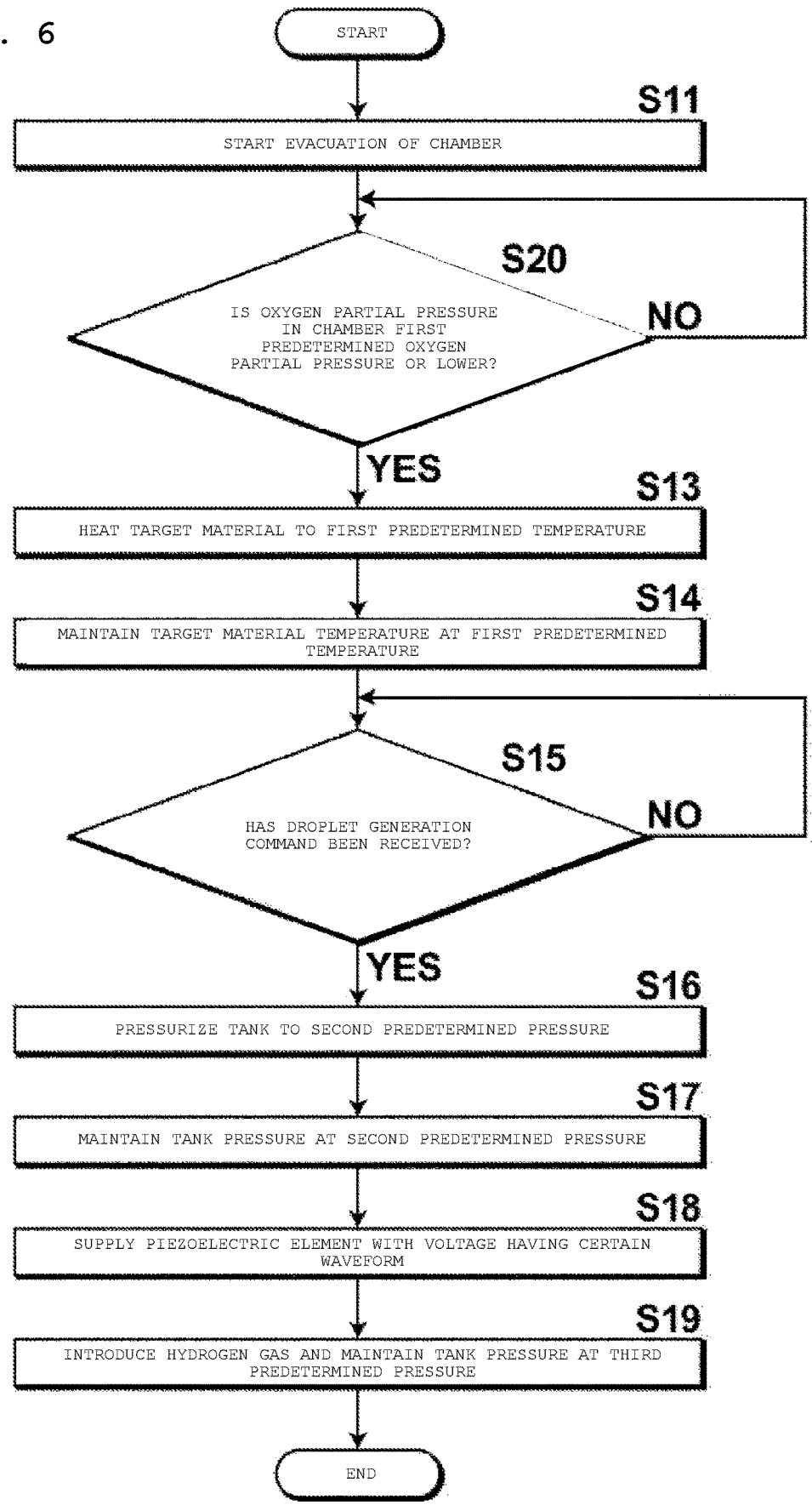
FIG. 6 is a flowchart that illustrates the flow of target generation processing in the EUV light generation apparatus illustrated in FIG. 5.

FIG. 6 is a flowchart that illustrates the flow of processes in the droplet generation in the EUV light generation apparatus 150. FIG. 7 is a timing chart illustrating timing of operation or the like of the elements related to the processes. The following will describe the operation of the first embodiment with reference to FIG. 6 and FIG. 7.

When the flowchart illustrated in FIG. 6 is compared with the flowchart in the comparative example illustrated in FIG. 2, the former one is different from the latter one in the point that Step S12 is replaced with Step S20. The controller 2 determines whether the oxygen partial pressure in the chamber 1 represented by the output signal from the oxygen partial pressure gauge 70 is the first predetermined oxygen partial pressure or lower at Step S20. If the oxygen partial pressure is higher than the first predetermined oxygen partial pressure, the process flow returns to Step S20, and the controller 2 repeats the determination process. If the oxygen partial pressure in the chamber 1 is the first predetermined oxygen partial pressure or lower, the processing of next Step S13 and the following steps is executed similarly to the comparative example. For example, the first predetermined oxygen partial pressure may be $1 \times 10^{-5}$ Pa. Note that, corresponding to the execution of the determination process at Step S20, the timing chart in FIG. 7 illustrates the change in the oxygen partial pressure in the chamber 1.

3.3 Effects of the First Embodiment

Figure 7:
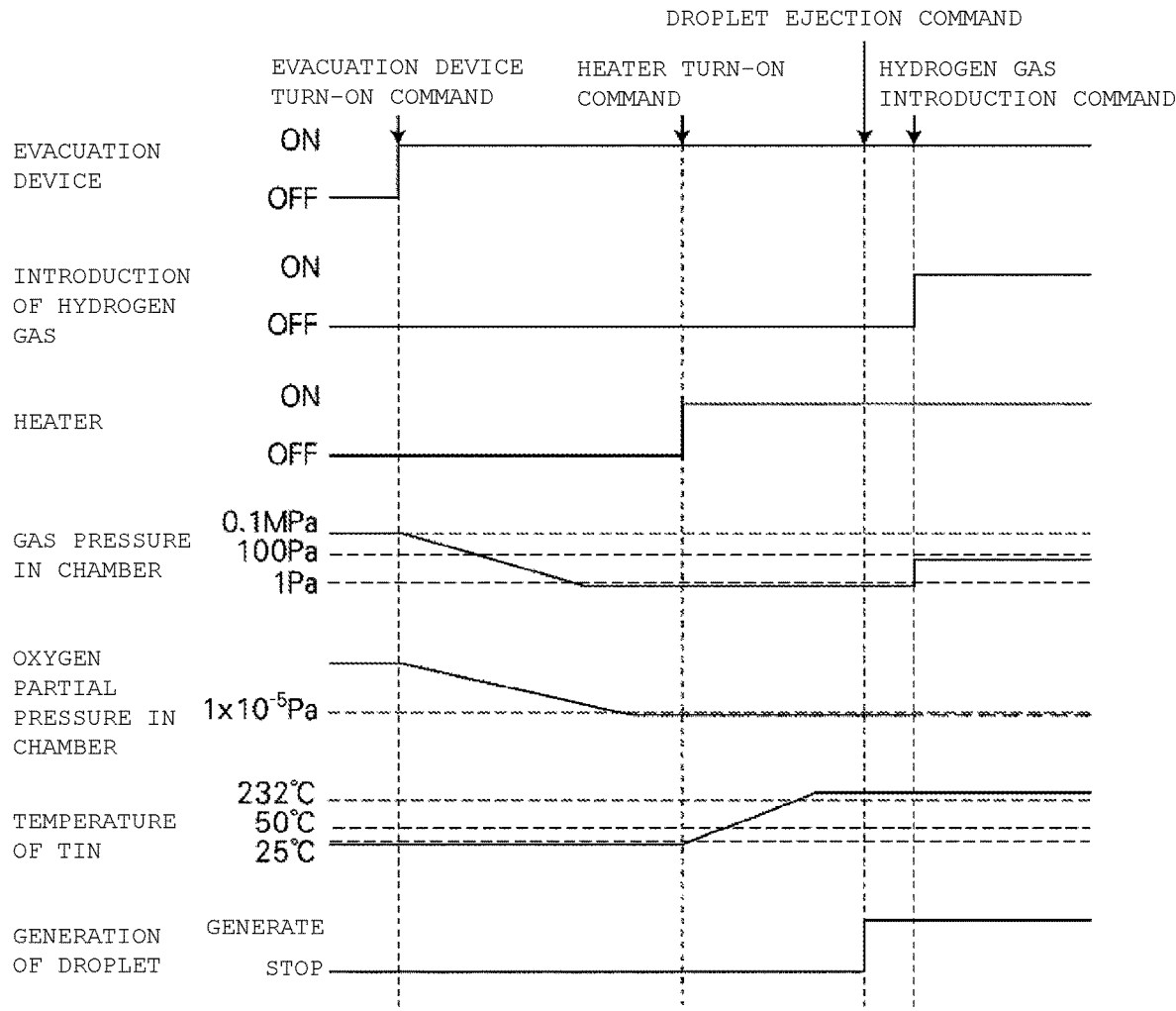
FIG. 7 is a timing chart for the target generation processing illustrated in FIG. 6.

With the execution of the process of Step S20, the droplet generation is executed under the condition that the oxygen partial pressure in the chamber 1 is $1 \times 10^{-5}$ Pa or lower as illustrated in the timing chart in FIG. 7. Thus, oxidation of the molten tin is effectively suppressed.

Figure 8:
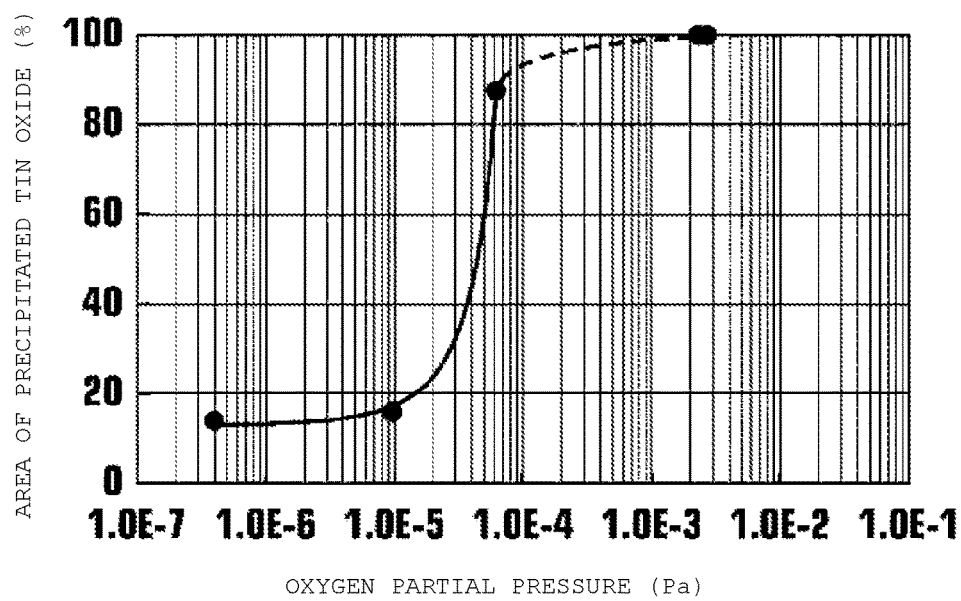
FIG. 8 is a graph that illustrates the relation between an oxygen partial pressure and an area of precipitated tin oxide.

The following will describe the aforementioned effect of suppressing oxidation in detail with reference to FIG. 8. The inventors and cooperators have melted tin at various oxygen partial pressures to investigate the relation between amounts of oxidation of tin and oxygen partial pressures. An amount of oxidation of tin was determined as a ratio of tin oxide area to a surface of tin. A tin oxide precipitated on the surface was observed with a scanning electron microscope (SEM). FIG. 8 shows the result. Note that a retention temperature was 290° C. and a retention time was 20 hours for tin. According to FIG. 8, when the oxygen partial pressure is $1 \times 10^{-5}$ Pa or lower, precipitation of tin oxide is remarkably suppressed. When the oxygen partial pressure is $1 \times 10^{-5}$ Pa or lower, decrease in an amount of precipitated tin oxide is mild, and it is considered that an amount of precipitated tin oxide is zero when the oxygen partial pressure is $8 \times 10^{-39}$ Pa. In addition, according to FIG. 8, even when the oxygen partial pressure is higher than $1 \times 10^{-5}$ Pa but $4 \times 10^{-5}$ Pa or lower, it is found that a remarkable effect of suppressing oxidation of tin can be obtained.

Note that it has been known that the aforementioned relation between amounts of oxidation of tin and oxygen partial pressures can be modeled by the sigmoid function and the relation illustrated in FIG. 8 was determined on the basis of the knowledge.

In the first embodiment, after the oxygen partial pressure in a space between the nozzle hole of the nozzle 34 and tin becomes $1 \times 10^{-5}$ Pa or lower, a tin ingot is melted and then tin is ejected from the nozzle hole, and thus oxidation of tin is remarkably suppressed in that space.

Furthermore, in the first embodiment, since a bearing part or the like of the dry pump is purged with high-purity nitrogen gas, it is possible to suppress intrusion of oxygen into the chamber 1 through the bearing part or the like. Thus, the oxygen partial pressure in the chamber 1 can be surely reduced.

4. Second Embodiment

4.1 Configuration of the Second Embodiment

Figure 9:
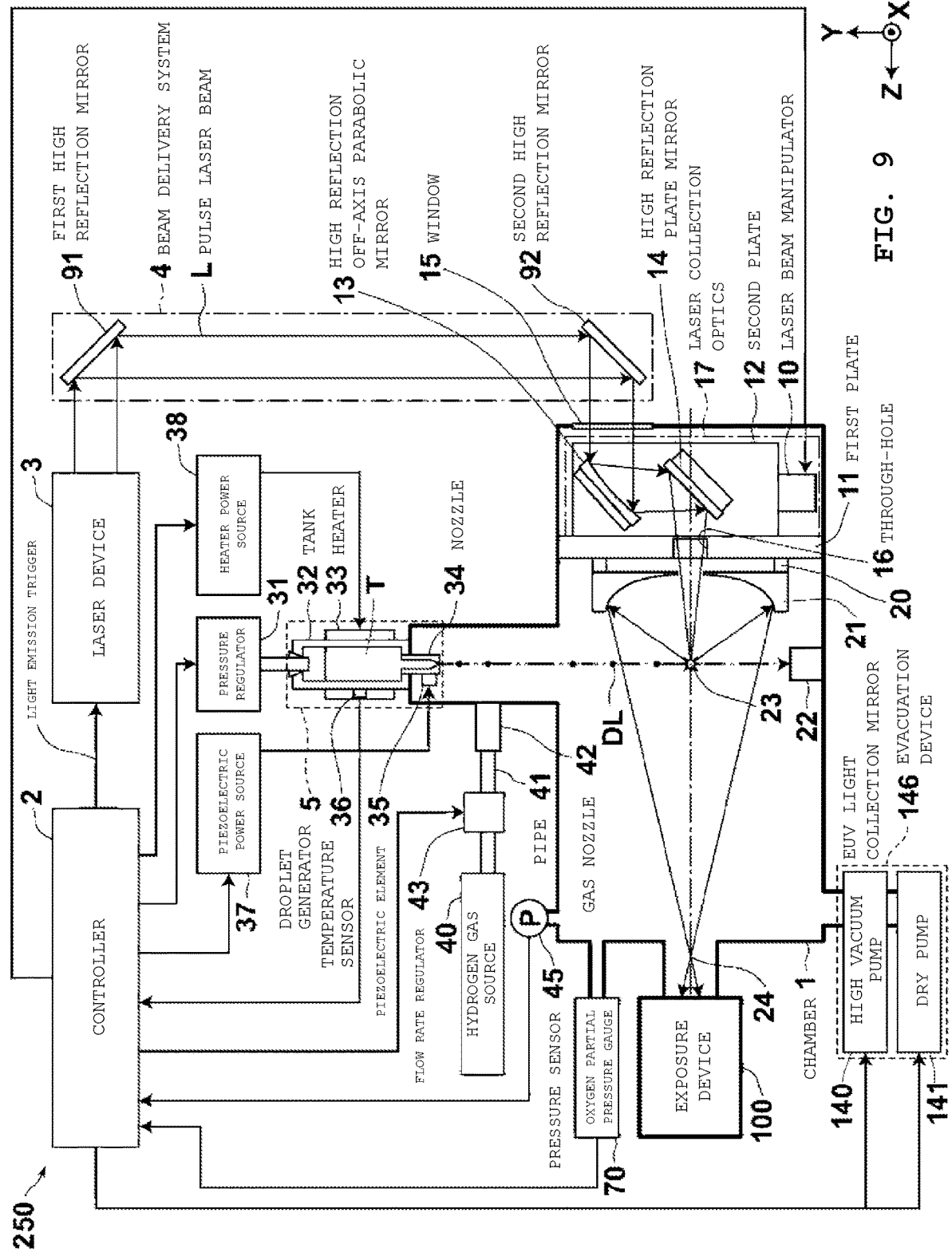
FIG. 9 is a schematic side view that illustrates the entire configuration of an EUV light generation apparatus according to a second embodiment.

Next, the second embodiment will be described with reference to FIG. 9, FIG. 10, and FIG. 11. FIG. 9 is a schematic view that illustrates a schematic configuration of an EUV light generation apparatus 250 including the chamber apparatus according to the second embodiment. When the EUV light generation apparatus 250 in the second embodiment is compared with the EUV light generation apparatus 50 in the comparative example illustrated in FIG. 1, the EUV light generation apparatus 250 is basically different from the EUV light generation apparatus 50 in the points that the former apparatus includes an oxygen partial pressure gauge 70 configured to measure the oxygen partial pressure in the chamber 1, and an evacuation device 146 including the high vacuum pump 140 and the dry pump 141 arranged in series. Note that the control by the controller 2 is partially different from the control by the controller 2 in the comparative example. The output signal from the oxygen partial pressure gauge 70 is input to the controller 2.

As the oxygen partial pressure gauge 70, a mass spectrometer or a zirconia oxygen analyzer, for example, is applicable. As the high vacuum pump 140, a turbomolecular pump, a cryopump, or a sputter ion pump, for example, is applicable. As the dry pump 141, a displacement pump, or a pump such as a roots type and a scroll type, for example, is applicable. It is preferable that a bearing part or the like of the dry pump 141 be purged with high-purity nitrogen gas or the like. In that case, it is preferable that nitrogen gas or the like used for purging have an oxygen concentration of 0.1 vol ppm or lower.

4.2 Operation of the Second Embodiment

Figure 10:
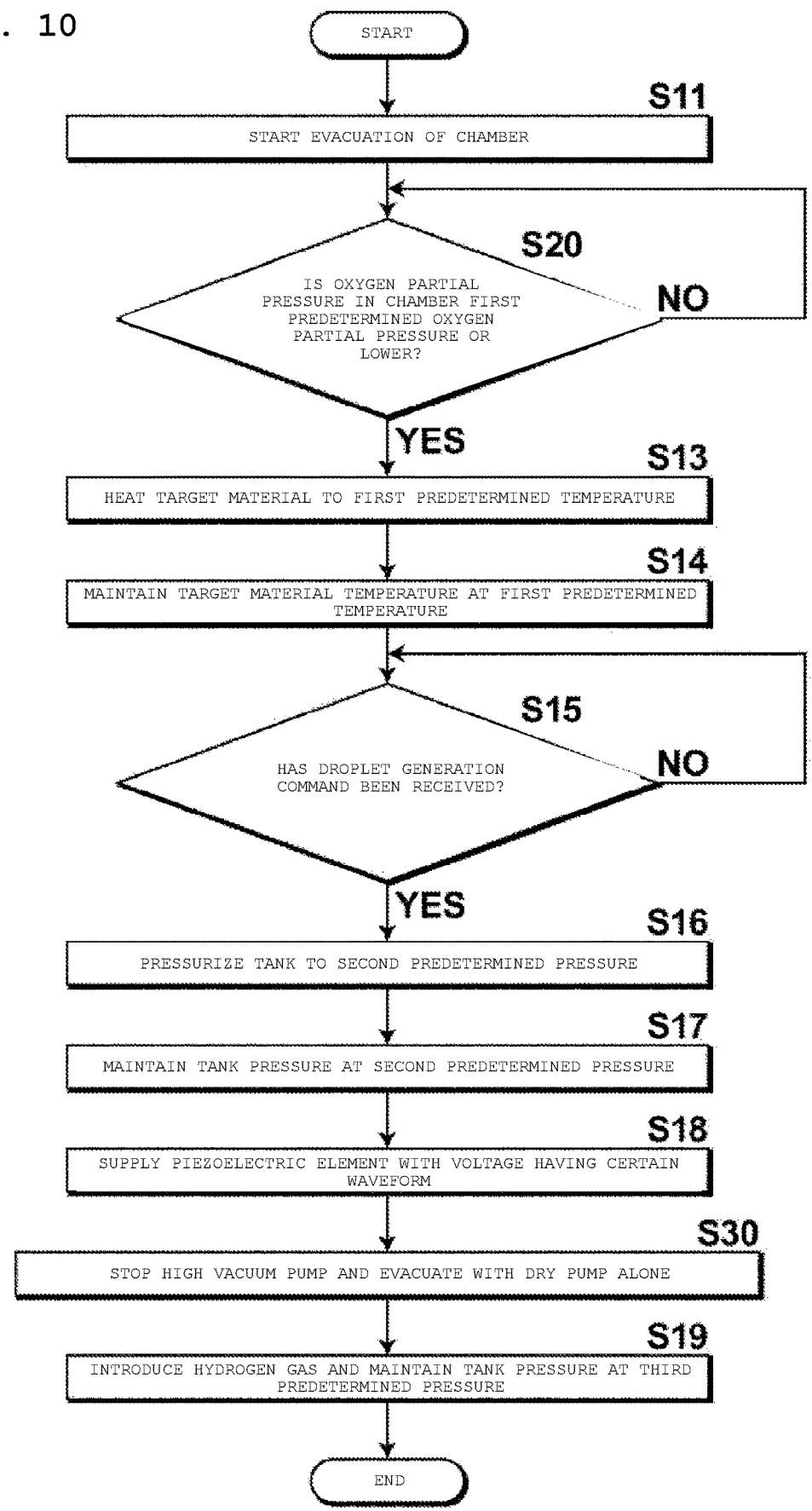
FIG. 10 is a flowchart that illustrates the flow of target generation processing in the EUV light generation apparatus illustrated in FIG. 9.

FIG. 10 is a flowchart that illustrates the flow of processes in the droplet generation in the EUV light generation apparatus 250. FIG. 11 is a timing chart illustrating timing of operation or the like of the elements related to the processes. The following will describe the operation of the second embodiment with reference to FIG. 10 and FIG. 11.

When the flowchart illustrated in FIG. 10 is compared with the flowchart in the comparative example illustrated in FIG. 2, the former one is different from the latter one in the points that Step S12 is replaced with Step S20 and Step S30 is present between Step S18 and Step S19. The controller 2 determines whether the oxygen partial pressure in the chamber 1 represented by the output signal from the oxygen partial pressure gauge 70 is the first predetermined oxygen partial pressure or lower at Step S20. If the oxygen partial pressure is higher than the first predetermined oxygen partial pressure, the process flow returns to Step S20, and the controller 2 repeats the determination process. If the oxygen partial pressure in the chamber 1 is the first predetermined oxygen partial pressure or lower, the processing of next Step S13 and the following steps is executed similarly to the comparative example. For example, the first predetermined oxygen partial pressure may be $1 \times 10^{-5}$ Pa.

The controller 2 turns on the entire evacuation device 146, that is, turns on the high vacuum pump 140 and the dry pump 141 at Step S11, and the controller 2 stops the high vacuum pump 140 and continues evacuation with the dry pump 141 alone at Step S30.

Figure 11:
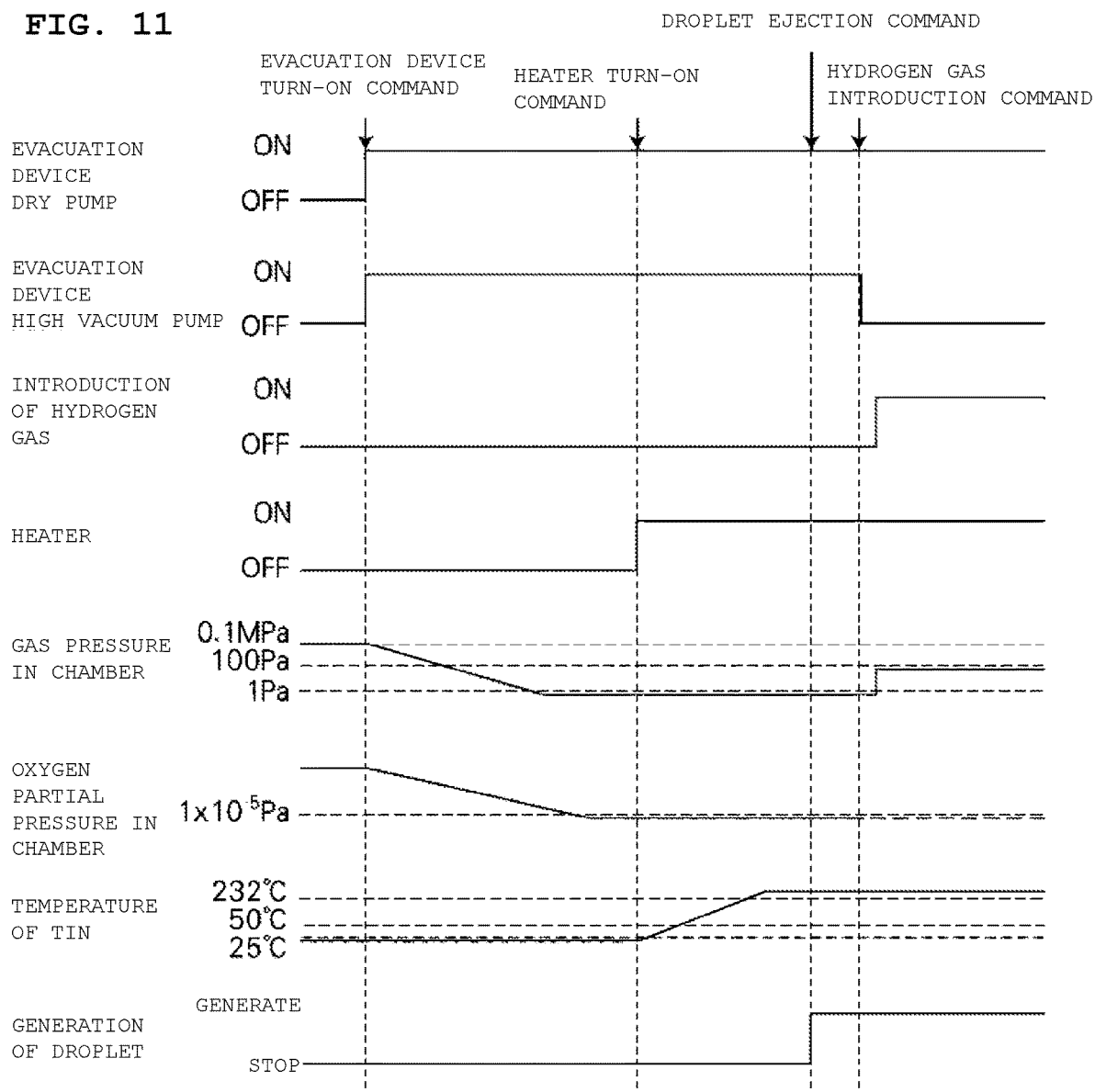
FIG. 11 is a timing chart for the target generation processing illustrated in FIG. 10.

Note that, corresponding to the execution of the determination process at Step S20, the timing chart in FIG. 11 illustrates the change in the oxygen partial pressure in the chamber 1. Furthermore, corresponding to the execution of the process at Step S30, the timing chart in FIG. 11 independently illustrates turning on and off of the high vacuum pump 140 and the dry pump 141.

4.3 Effects of the Second Embodiment

With the execution of the process of Step S20, the droplet generation is executed under the condition that the oxygen partial pressure in the chamber 1 is $1 \times 10^{-5}$ Pa or lower as illustrated in the timing chart in FIG. 11. Thus, oxidation of the molten tin is effectively suppressed. In the second embodiment, after the oxygen partial pressure in a space between the nozzle hole of the nozzle 34 and tin becomes $1 \times 10^{-5}$ Pa or lower, a tin ingot is melted and then tin is ejected from the nozzle hole, and thus oxidation of tin is remarkably suppressed in that space.

Since the evacuation device 146 in the second embodiment includes the high vacuum pump 140 and the dry pump 141 arranged in series, the pressure in the chamber 1 can be reduced to a pressure in a high-vacuum state, more specifically, between about $1 \times 10^{-1}$ Pa and $1 \times 10^{-5}$ Pa. Thus, the oxygen partial pressure in the chamber 1 can be easily reduced to $1 \times 10^{-5}$ Pa or lower.

Furthermore, since a bearing part or the like of the dry pump 141 is purged with high-purity nitrogen gas or the like, it is possible to suppress intrusion of oxygen into the chamber 1 through the bearing part or the like, and thus the oxygen partial pressure in the chamber 1 can be easily reduced. In addition to the aforementioned matters, the effects obtained by the second embodiment are substantially the same as the effects of the first embodiment.

5. Third Embodiment 5.1 Configuration of the Third Embodiment

Figure 12:
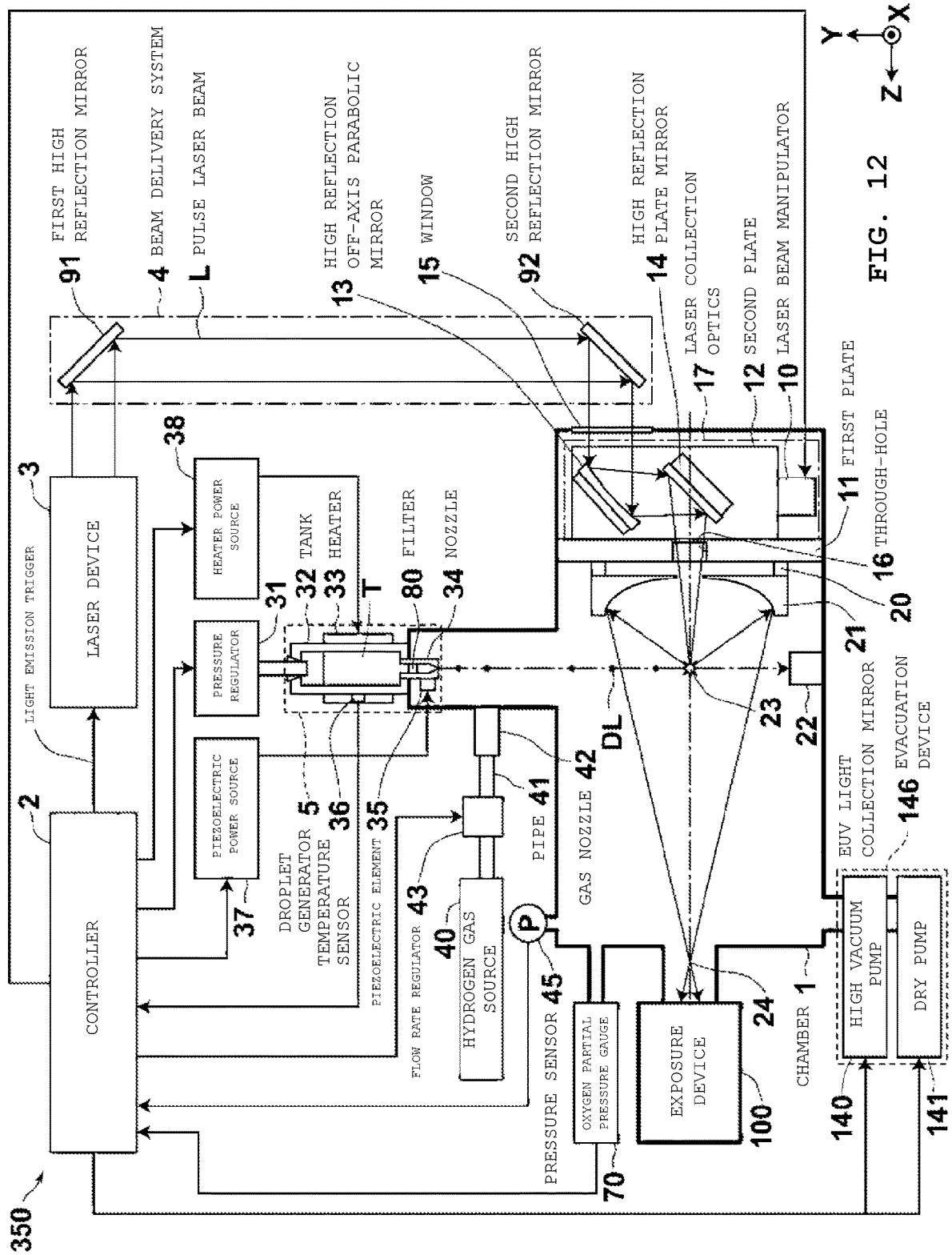
FIG. 12 is a schematic side view that illustrates the entire configuration of an EUV light generation apparatus according to a third embodiment.

Next, the third embodiment will be described with reference to FIG. 12, FIG. 13, and FIG. 14. FIG. 12 is a schematic view that illustrates a schematic configuration of an EUV light generation apparatus 350 including the chamber apparatus according to the third embodiment. When the EUV light generation apparatus 350 in the third embodiment is compared with the EUV light generation apparatus 250 in the second embodiment illustrated in FIG. 9, the EUV light generation apparatus 350 is basically different from the EUV light generation apparatus 250 in the point that the former apparatus includes a filter 80 disposed in the nozzle 34. More specifically, the filter 80 is disposed between the nozzle hole of the nozzle 34 and the tank 32. The filter 80 is configured to capture the particles of tin oxide or other substances.

5.2 Operation of the Third Embodiment

Figure 13:
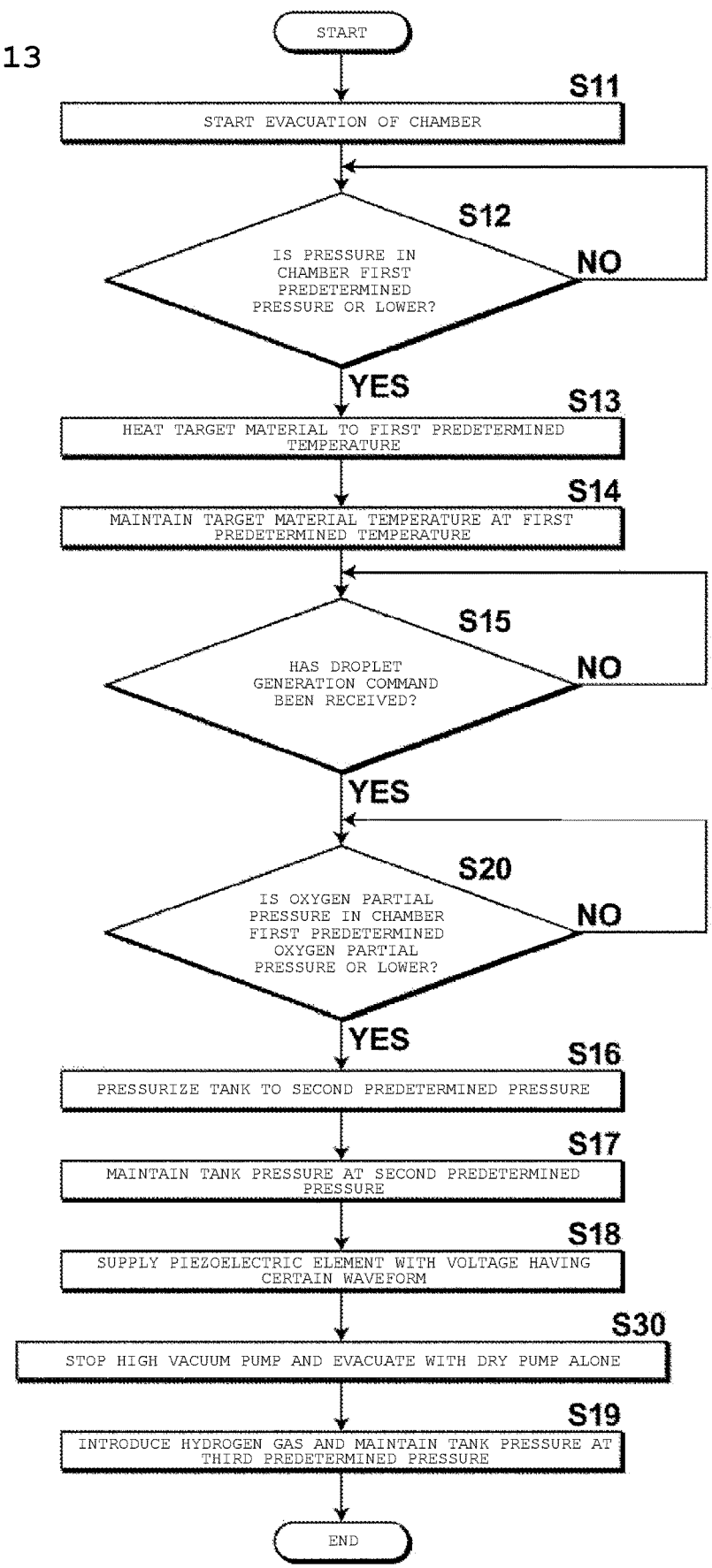
FIG. 13 is a flowchart that illustrates the flow of target generation processing in the EUV light generation apparatus illustrated in FIG. 12.

FIG. 13 is a flowchart that illustrates the flow of processes in the droplet generation in the EUV light generation apparatus 350. FIG. 14 is a timing chart illustrating timing of operation or the like of the elements related to the processes. The following will describe the operation of the third embodiment with reference to FIG. 13 and FIG. 14.

When the flowchart illustrated in FIG. 13 is compared with the flowchart in the comparative example illustrated in FIG. 2, the former one is different from the latter one in the points that Step S20 is present between Step S15 and Step S16 and Step S30 is present between Step S18 and Step S19. The controller 2 determines whether the oxygen partial pressure in the chamber 1 represented by the output signal from the oxygen partial pressure gauge 70 is the first predetermined oxygen partial pressure or lower at Step S20. If the oxygen partial pressure is higher than the first predetermined oxygen partial pressure, the process flow returns to Step S20, and the controller 2 repeats the determination process. If the oxygen partial pressure in the chamber 1 is the first predetermined oxygen partial pressure or lower, the process of Step S16 and the following steps is executed similarly to the comparative example. For example, the first predetermined oxygen partial pressure may be $1 \times 10^{-5}$ Pa.

The controller 2 turns on the entire evacuation device 146, that is, turns on the high vacuum pump 140 and the dry pump 141 at Step S11, and the controller 2 stops the high vacuum pump 140 and continues evacuation with the dry pump 141 alone at Step S30.

Figure 14:
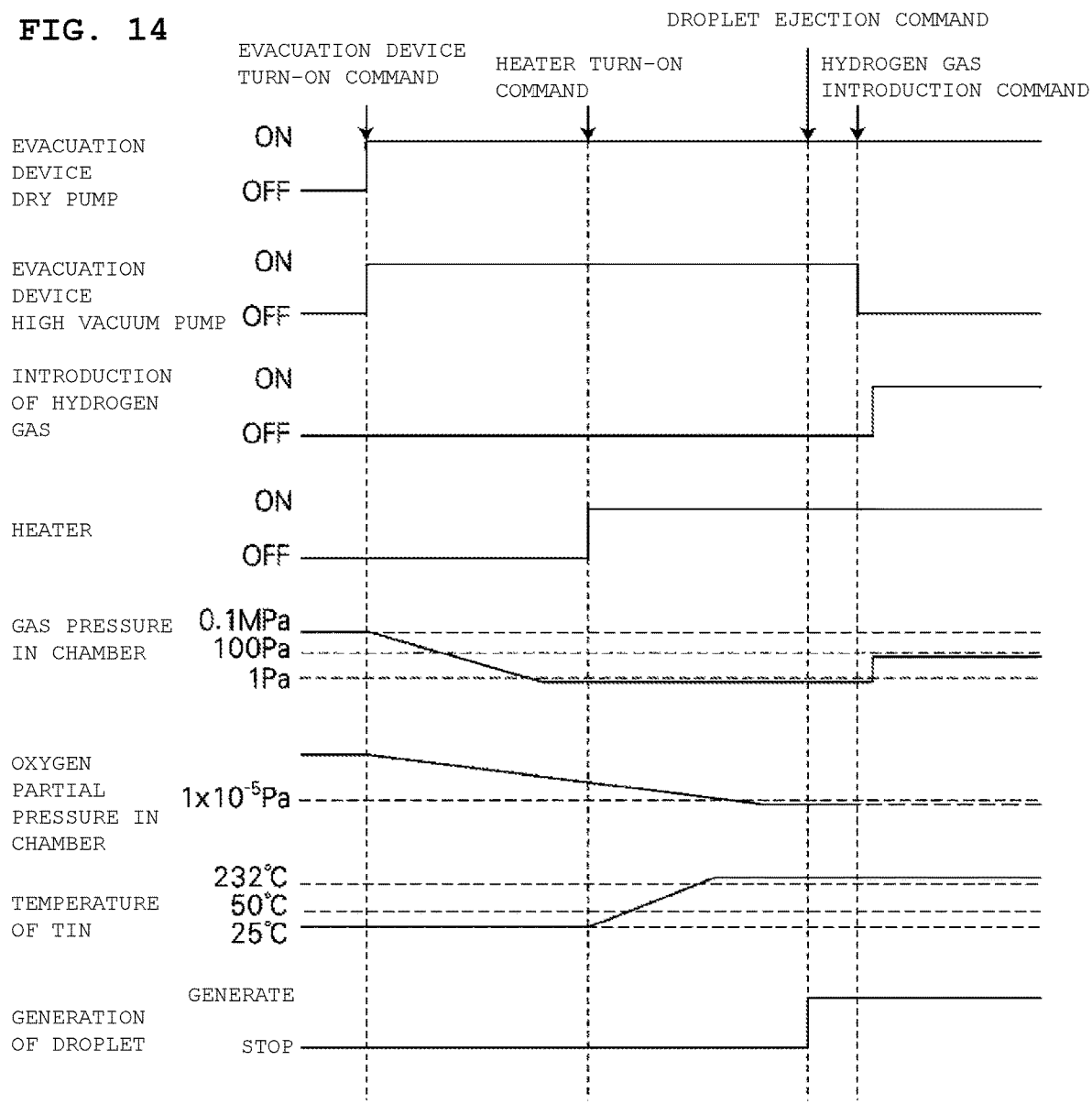
FIG. 14 is a timing chart for the target generation processing illustrated in FIG. 13.

Note that, corresponding to the execution of the determination process at Step S20, the timing chart in FIG. 14 illustrates the change in the oxygen partial pressure in the chamber 1. Furthermore, corresponding to the execution of the process at Step S30, the timing chart in FIG. 14 independently illustrates turning on and off of the high vacuum pump 140 and the dry pump 141.

5.3 Effects of the Third Embodiment

In the third embodiment, when a tin ingot is melted and stored in the tank 32, tin is present on an upstream side in a flow direction of the tin with respect to the filter 80, and thus, even if tin oxide is precipitated, it can be captured by the filter 80. Furthermore, after the oxygen partial pressure in a space between the filter 80 and the nozzle hole of the nozzle 34 becomes $1 \times 10^{-5}$ Pa or lower, the tank is pressurized and then tin is ejected from the nozzle hole, and thus oxidation of tin is remarkably suppressed in that space between the filter 80 and the nozzle hole.

With the execution of the process of Step S20, the droplet generation is executed under the condition that the oxygen partial pressure in the chamber 1 is $1 \times 10^{-5}$ Pa or lower as illustrated in the timing chart in FIG. 14. Thus, oxidation of the molten tin is effectively suppressed. In the third embodiment, when the pressure in the chamber 1 becomes the first predetermined pressure (for example, 1 Pa) or lower, the target material T can be heated. Furthermore, it only needs to reduce the oxygen partial pressure to $1\times10^{-5}$ Pa or lower before pressurizing the tank 32. Thus, the time from start of evacuation of the chamber 1 to ejection of the droplet DL can be reduced.

6. Fourth Embodiment 6.1 Configuration of the Fourth Embodiment

The control by the controller 2 in the fourth embodiment is different from those in the aforementioned embodiments. Here, any configuration of the first embodiment, the second embodiment, or the third embodiment can be applied to the basic configuration of the fourth embodiment.

6.2 Operation of the Fourth Embodiment

The operation of the fourth embodiment has a characteristic in an operation after droplet generation. Thus, the operation before droplet generation in the fourth embodiment may be the same as that of the first embodiment, the second embodiment, or the third embodiment.

Figure 15:
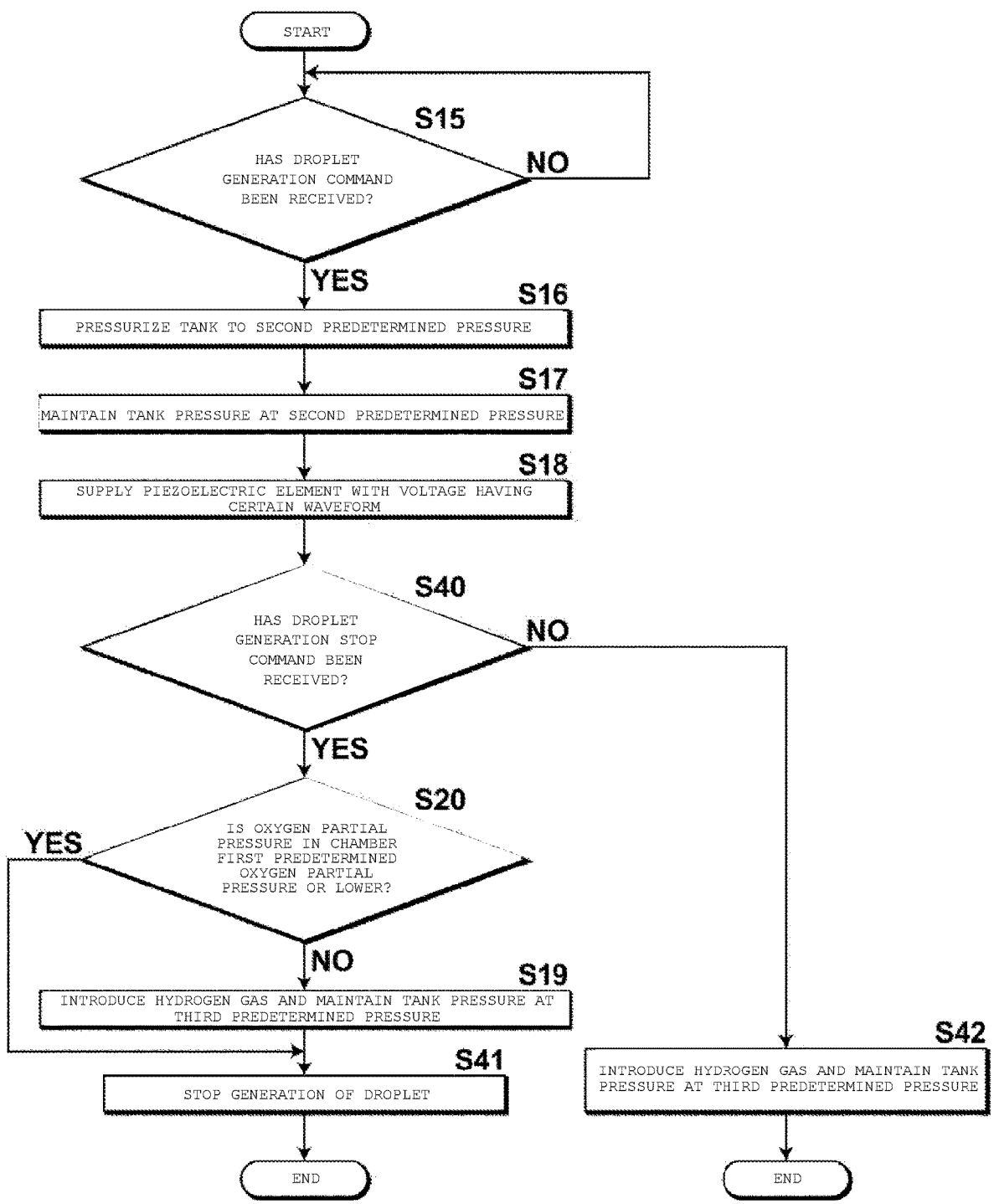
FIG. 15 is a flowchart that illustrates the flow of processing in a target generation method according to a fourth embodiment.
Figure 16:
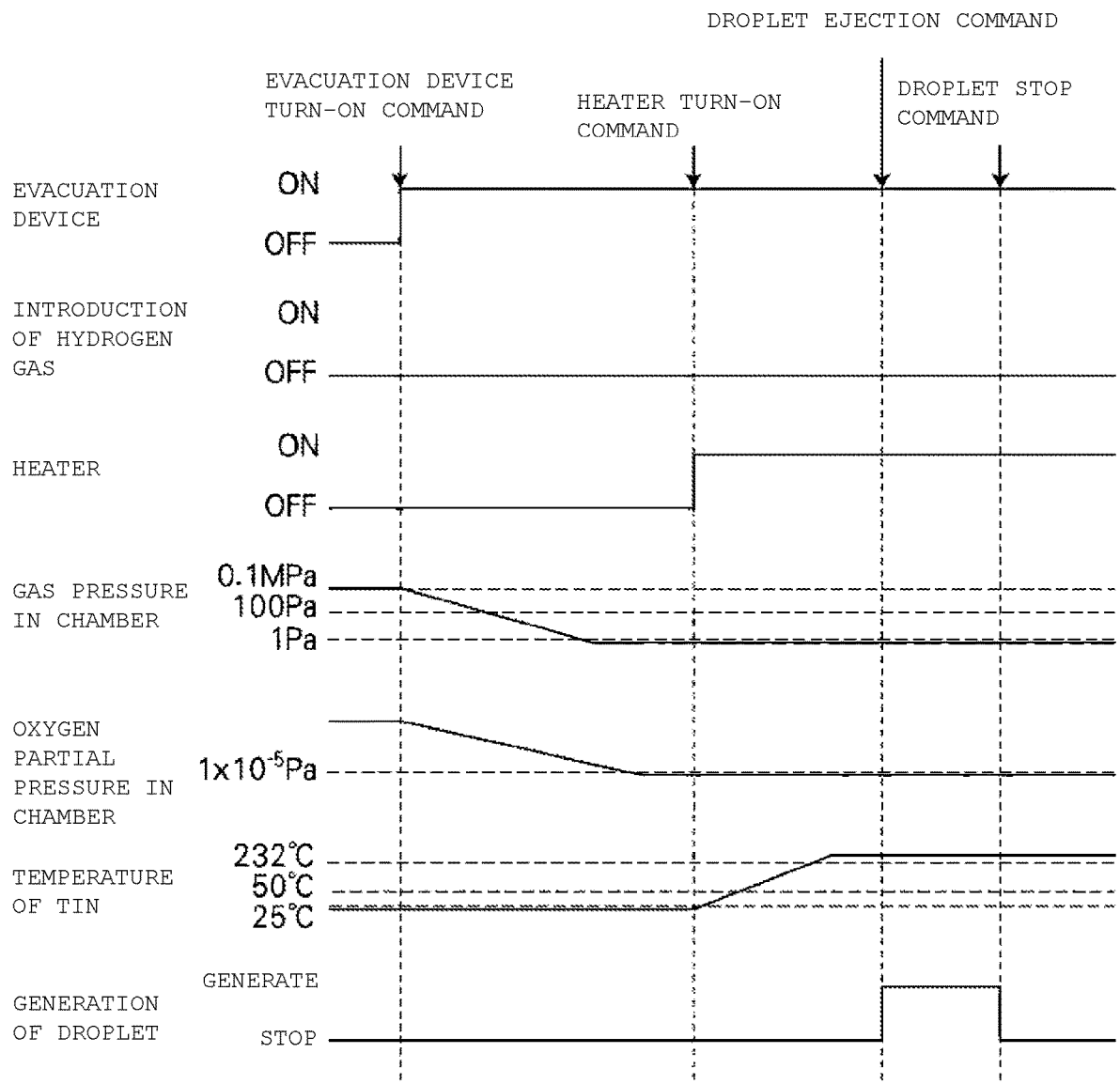
FIG. 16 is a timing chart for a part of the processing illustrated in FIG. 15.
Figure 17:
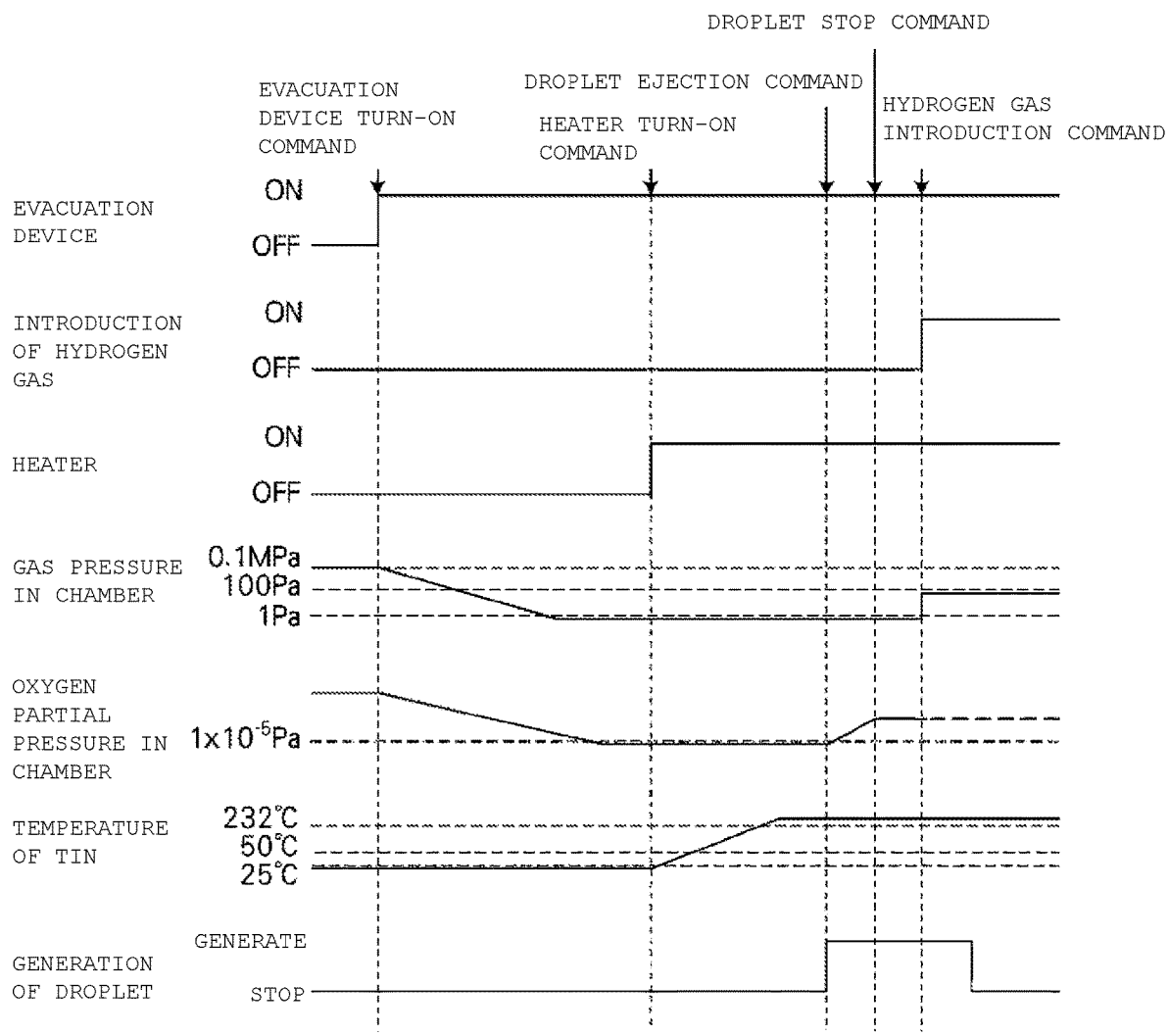
FIG. 17 is a timing chart for another part of the processing illustrated in FIG. 15.

FIG. 15 is a flowchart that illustrates the flow of droplet generation and stop processing and processes related thereto in the fourth embodiment. FIG. 16 and FIG. 17 are timing charts each illustrating timing of operation or the like of the elements related to the processes. FIG. 16 is a timing chart for the case where the oxygen partial pressure in the chamber 1 is the aforementioned first predetermined oxygen partial pressure or lower when the controller 2 receives a droplet generation stop command. By contrast, FIG. 17 is a timing chart for the case where the oxygen partial pressure in the chamber 1 is higher than the aforementioned first predetermined oxygen partial pressure when the controller 2 receives the droplet generation stop command.

The configuration and the operation of the fourth embodiment is as described above, and thus the following explanation is made on the premise that the configuration according to the first embodiment illustrated in FIG. 5 and a part of the processing illustrated in FIG. 6 are applied to the fourth embodiment. Step S15 to Step S18 and Step S19 illustrated in FIG. 15 are the same as Step S15 to Step S19 illustrated in FIG. 6. In FIG. 15, Step S40 and Step S20 are present between Step S18 and Step S19. The controller 2 in the fourth embodiment controls the processing from Step S15 to Step S18 similarly to the first embodiment. Next, upon processing Step S18, the controller 2 determines whether the droplet generation stop command ("DROPLET STOP COMMAND" in FIG. 16 and FIG. 17) has been received at Step S40.

When the droplet generation stop command has not been received, the controller 2 introduces hydrogen gas from the hydrogen gas source 40 into the chamber 1 to maintain the state of the chamber 1 at Step S42. Then, the sequence of the processing is completed.

When the droplet generation stop command has been received, the controller 2 determines whether the oxygen partial pressure in the chamber 1 represented by the output signal from the oxygen partial pressure gauge 70 (see FIG. 5) is the first predetermined oxygen partial pressure or lower at Step S20. When the controller 2 determines that the oxygen partial pressure is the first predetermined oxygen partial pressure or lower, the controller 2 stops droplet generation at Step S41, and the sequence of the processing is completed. When the controller 2 determines that the oxygen partial pressure is higher than the first predetermined oxygen partial pressure at Step S20, the controller 2 introduces hydrogen gas from the hydrogen gas source 40 into the chamber 1 ("HYDROGEN GAS INTRODUCTION COMMAND" in FIG. 17) to maintain the state at Step S19. Next, the controller 2 stops droplet generation at Step S41, and the sequence of the processing is completed. Note that specific processing to stop droplet generation is performed as follows: the pressure in the tank 32 is reduced to the second predetermined pressure or lower; and supplying the piezoelectric element 35 with a voltage having a certain waveform is stopped.

Note that, if the high vacuum pump is used as the evacuation device before introduction of hydrogen gas at Step S19, it is preferable that the high vacuum pump be stopped and then droplet generation be stopped.

6.3 Effects of the Fourth Embodiment

As described above, in the fourth embodiment, when the oxygen partial pressure in the chamber 1 is higher than the first predetermined oxygen partial pressure, generation of the droplet DL is not stopped. In addition, when the oxygen partial pressure in the chamber 1 is the first predetermined oxygen partial pressure or lower, or after introduction of hydrogen gas for reducing oxygen partial pressure, generation of the droplet DL is stopped. Thus, the oxygen partial pressure in the chamber 1 after generation of the droplet DL is stopped becomes the first predetermined oxygen partial pressure or lower. Accordingly, with the fourth embodiment, it is possible to suppress oxidation of the tin present on the nozzle hole exposed to the atmosphere in the chamber after generation of the droplet DL is stopped.

7. Fifth Embodiment 7.1 Configuration of the Fifth Embodiment

The control by the controller 2 in the fifth embodiment is different from those in the aforementioned embodiments. Here, any configuration of the first embodiment, the second embodiment, or the third embodiment can be applied to the basic configuration of the fifth embodiment. Note that the oxygen partial pressure gauge 70 illustrated in FIG. 5 or other drawings may be omitted.

7.2 Operation of the Fifth Embodiment

The operation of the fifth embodiment is characterized in that measurement of oxygen partial pressure is unnecessary, and except that point, the operation may be the same as those of the first embodiment, the second embodiment, or the third embodiment. Thus, the following will describe the operation of the fifth embodiment on the basis of the operation of the first embodiment illustrated in FIG. 6.

Figure 18:
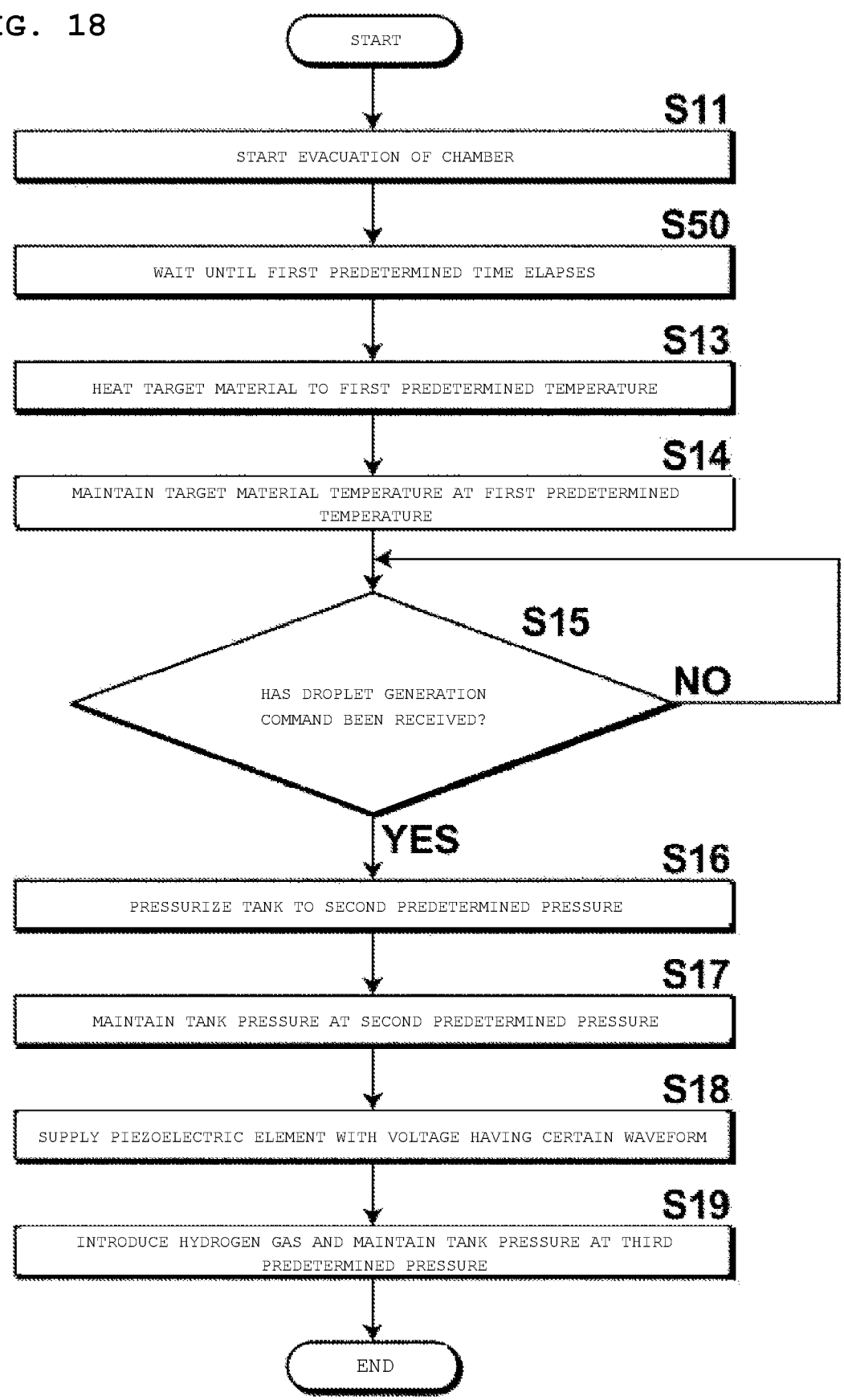
FIG. 18 is a flowchart that illustrates the flow of target generation processing in a target generation method according to a fifth embodiment.

FIG. 18 is a flowchart that illustrates the flow of processes in the droplet generation in the fifth embodiment. When the flowchart illustrated in FIG. 18 is compared with the flowchart in the first embodiment illustrated in FIG. 6, the former one is different from the latter one only in the point that Step S50 is present instead of Step S20. At Step S13 following Step S50, the heater 33 is heated to heat the target material T to the first predetermined temperature, and at Step S50, the processing waits until a first predetermined time elapses before the heating.

7.3 Effects of the Fifth Embodiment

By setting the aforementioned first predetermined time to a preferable value based on, for example, experiments or experiences, the gas in the chamber 1 is evacuated for a sufficient time period and thus the oxygen partial pressure in the chamber 1 becomes the first predetermined oxygen partial pressure or lower. For example, the first predetermined oxygen partial pressure may be $1\times10^{-5}$ Pa. Thus, after the oxygen partial pressure in a space between the nozzle hole of the nozzle 34 and tin becomes $1\times10^{-5}$ Pa or lower, a tin ingot is melted and then tin is ejected from the nozzle 34 as the droplet DL. Thus, the oxidation of tin in the space can be remarkably suppressed. In addition, in the fifth embodiment, the oxygen partial pressure gauge can be unnecessary, and thus the configuration of the apparatus can be simplified.

The description above is intended to be illustrative and the present disclosure is not limited thereto. Therefore, it would be obvious to those skilled in the art that various modifications to the embodiments of the present disclosure would be possible as long as they do not stray from the spirit and the scope of the appended claims.

The terms which are employed in the present specification and the appended claims are to be interpreted as "not limiting". For example, the terms "include" and "including" are to be interpreted to mean "including the described elements but not limited thereto". The term "have" is to be interpreted to mean "having the described elements but not limited thereto". Furthermore, the indefinite articles "a" and "an", as well as the word "one" in the present specification as well as the appended claims are to be interpreted to mean "at least one" or "one or more".

The invention claimed is:

1. A chamber apparatus, comprising:
   a chamber;
   a target generation device coupled to but structurally separated from the chamber, configured to supply tin as a target material to a certain region in the chamber, and including
   1. a tank part configured to store tin,
   2. a variable temperature device configured to change a temperature of the tin in the tank part,
   3. a pressure regulator configured to change a pressure in the tank part, and
   4. a nozzle part having a nozzle hole configured to eject liquefied tin;
   a gas source configured to supply gas containing hydrogen gas into the chamber;
   an evacuation device configured to evacuate gaseous body in the chamber; and
   a controller configured to control generation of a target and to control
   A. the evacuation device to maintain an oxygen partial pressure in the chamber at $4 \times 10^{-5}$ Pa or lower,
   B. the variable temperature device to melt the tin,
   C. the pressure regulator to eject the molten tin from the nozzle hole, and
   D. the gas source to supply the gas containing hydrogen gas into the chamber after the ejection.

2. The chamber apparatus according to claim 1, wherein the controller controls the evacuation device to maintain the oxygen partial pressure in the chamber at $1 \times 10^{-5}$ Pa or lower.

3. The chamber apparatus according to claim 1, wherein the controller performs the control B after the control A.

4. The chamber apparatus according to claim 1, wherein the controller performs the control A after the control B.

5. The chamber apparatus according to claim 1, further comprising an oxygen partial pressure gauge configured to measure the oxygen partial pressure in the chamber.

6. The chamber apparatus according to claim 1, wherein the evacuation device includes a high vacuum pump and a dry pump that are arranged in series.

7. The chamber apparatus according to claim 6, wherein the high vacuum pump includes at least one of a turbomolecular pump, a cryopump, and a sputter ion pump.

8. The chamber apparatus according to claim 6, wherein the dry pump is purged with gas having an oxygen concentration of 0.1 vol.ppm or lower.

9. The chamber apparatus according to claim 6, wherein evacuation is performed by the dry pump alone after the oxygen partial pressure in the chamber becomes $4 \times 10^{-5}$ Pa or lower.

10. The chamber apparatus according to claim 1, wherein the tank part includes a filter configured to capture particles, and
the tin before melting is exclusively presented on an upstream side in a flow direction of the tin with respect to the filter.

11. The chamber apparatus according to claim 1, wherein, when the oxygen partial pressure in the chamber is equal to or lower than $4 \times 10^{-5}$ Pa and/or the gas is introduced into the chamber, ejection of the tin is stopped.

12. The chamber apparatus according to claim 1, further comprising a flow rate regulator configured to regulate a flow rate of the gas flowing into the chamber.

13. A target generation method using a chamber apparatus, the chamber apparatus including:
    a chamber;
    a target generation device coupled to but structurally separated from the chamber, configured to supply tin as a target material to a certain region in the chamber, and including
    1. a tank part configured to store tin,
    2. a variable temperature device configured to change a temperature of the tin in the tank part,
    3. a pressure regulator configured to change a pressure in the tank part, and
    4. a nozzle part having a nozzle hole configured to eject liquefied tin;
    a gas source configured to supply gas containing hydrogen gas into the chamber;
    an evacuation device configured to evacuate gaseous body in the chamber; and
    a controller configured to control generation of a target, to supply tin to the certain region in the chamber, the method comprising controlling, by the controller:
    A. the evacuation device to maintain an oxygen partial pressure in the chamber at $4 \times 10^{-5}$ Pa or lower;
    B. the variable temperature device to melt the tin;
    C. the pressure regulator to eject the molten tin from the nozzle hole, and
    D. the gas source to supply the gas containing hydrogen gas into the chamber after the ejection.

14. The target generation method according to claim 13, wherein controlling the evacuation device by the controller is performed to maintain the oxygen partial pressure in the chamber at $1 \times 10^{-5}$ Pa or lower.

15. The target generation method according to claim 13, wherein a high vacuum pump and a dry pump that are arranged in series are used as the evacuation device.

16. The target generation method according to claim 13, wherein the method is able to adjust a flow rate of the gas flowing into the chamber.

17. An extreme ultraviolet (EUV) light generation apparatus comprising:
    a chamber;
    a target generation device coupled to but structurally separated from the chamber, configured to supply tin as a target material to a certain region in the chamber, and including
    1. a tank part configured to store tin,
    2. a variable temperature device configured to change a temperature of the tin in the tank part,
    3. a pressure regulator configured to change a pressure in the tank part, and
    4. a nozzle part having a nozzle hole configured to eject liquefied tin;
    a gas source configured to supply gas containing hydrogen gas into the chamber;

an evacuation device configured to evacuate gaseous body in the chamber;

a controller configured to control generation of a target and to control
   A. the evacuation device to maintain an oxygen partial pressure in the chamber at $4\times10^{-5}$ Pa or lower,
   B. the variable temperature device to melt the tin,
   C. the pressure regulator to eject the molten tin from the nozzle hole, and
   D. the gas source to supply the gas containing hydrogen gas into the chamber after the ejection;

a laser device configured to emit a laser beam to the tin supplied into the chamber; and a light collection mirror configured to collect EUV light radiated from plasma of the tin generated by irradiating the tin with the laser beam and output the collected EUV light.

18. The EUV light generation apparatus according to claim 17, wherein the controller controls the evacuation device to maintain the oxygen partial pressure in the chamber at $1\times10^{-5}$ Pa or lower.

* * * * *